US009886532B1

(12) United States Patent
Scallon

(10) Patent No.: US 9,886,532 B1
(45) Date of Patent: Feb. 6, 2018

(54) DATA INTEGRITY PROTECTION MECHANISM

(76) Inventor: Gregory M. Scallon, Hunts Point, MA (US)

( * ) Notice: Subject to any disclaimer, the term of this patent is extended or adjusted under 35 U.S.C. 154(b) by 200 days.

(21) Appl. No.: 12/804,544

(22) Filed: Jul. 23, 2010

Related U.S. Application Data

(63) Continuation of application No. 10/961,434, filed on Oct. 7, 2004, now abandoned.

(51) Int. Cl.
G06G 7/48 (2006.01)
G06F 17/50 (2006.01)

(52) U.S. Cl.
CPC ................. G06F 17/5009 (2013.01)

(58) Field of Classification Search
CPC .................................. G06F 17/5009
USPC ............................................. 703/6
See application file for complete search history.

(56) References Cited

U.S. PATENT DOCUMENTS

| | | | | |
|---|---|---|---|---|
| 5,395,455 | A * | 3/1995 | Scott et al. | 127/37 |
| 5,428,789 | A * | 6/1995 | Waldron, III | 718/103 |
| 6,317,872 | B1 * | 11/2001 | Gee et al. | 717/152 |
| 6,453,460 | B1 * | 9/2002 | Keyes | 717/108 |
| 6,560,627 | B1 * | 5/2003 | McDonald et al. | 718/103 |
| 6,874,144 | B1 * | 3/2005 | Kush | 718/103 |
| 2002/0069039 | A1 * | 6/2002 | Ricks et al. | 703/1 |
| 2003/0004683 | A1 * | 1/2003 | Nemawarkar | 702/186 |
| 2004/0015833 | A1 * | 1/2004 | Dellarocas et al. | 717/106 |

OTHER PUBLICATIONS

Greg Scallon, "Model Based Development," May 4, 1999, Software Technology Conference, pp. 1-43.*
Peter H. Feiler et al., "Embedded System Architecture Analysis Using SAE AADL," Jun. 2004, Carnegie Mellon University, pp. 1-35.*
Xianghua Deng et al., "Invariant-based specification, synthesis, and verification of synchronization in concurrent programs," 2002, proceedings of the 24th International Conference on Software Engineering, pp. 442-452.*
Yun Wang et al., "Scheduling fixed-priority tasks with preemption threshold," 1999, Proceedings of the Sixth International Conference on Real-Time Computing Systems and Applications, pp. 328-335.*

(Continued)

*Primary Examiner* — Kamini S Shah
*Assistant Examiner* — Russ Guill
(74) *Attorney, Agent, or Firm* — Kenneth Paley

(57) ABSTRACT

Generally and not exclusively, there is disclosed a method for providing data integrity mechanisms to a system, and converting the characteristics into a database. In an embodiment, system information associating individual tasks of the system with objects that the task references and with objects that the task generates; information describing for individual processes of the system the chain of to-be-executed steps of each process; and information describing physical configuration of the system including an allocation of processes to processors and the relative priority of the processes are developed. From that information, algorithms are implemented to indicate data integrity protection mechanisms, such as task preemption levels, steps of processes to inhibit while a task of a process is executing, process step locks, and indications of steps that may not be execute concurrently with another task from the process.

23 Claims, 17 Drawing Sheets

(56) References Cited

OTHER PUBLICATIONS

Alan Burns et al., "HRT-HOOD : A Structured Design Method for Hard Real-Time Ada Systems", 1995, Elsevier Science B.V., pp. 1-102, 157-160.*

Hassan Gomaa, "Software Design Methods for Concurrent and Real-Time Systems," 1993, Addison-Wesley Publishing Company, pp. 243-253.*

K.H. Kane, "Toward New-Generation Real-Time Object-Oriented Computing," 1995, Proceedings of the Fifth IEEE Computer Society Workshop on Future Trends of Distributed Computing Systems, pp. 520-529.*

John Regehr et al., "Lock inference for systems software," 2003, Proceedings of the Second AOSD Workshop on Aspects, Components, and Patterns for Infrastructure Software, six pages.*

Hermann Kopetz, "Real-time systems design principles for distributed embedded applications," 2002, Kluwer Academic Publishers, pp. 234-237.*

Pedro C. Diniz, "Lock coarsening: eliminating lock overhead in automatically parallelized object-based programs," 1998, Journal of Parallel and Distributed Computing, vol. 49, pp. 218-244.*

Lui Sha et al., "Priority inheritance protocols: an approach to real-time synchronization," 1990, vol. 39, No. 9, pp. 1175-1185.*

Mark Grand, "Java Language Reference," second edition, 1997, O'Reilly & Associates, p. 217.*

Peter C. Dibble, "Real-time JAVA Platform Programming," 2002, Sun Microsystems, pp. 61-68, 137-145.*

Steve Kleiman et al., "Programming with Threads," 1996, SunSoft Press, pp. 70, 277-294.*

Theodore P. Baker et al., "An Architecture for Real-Time Software Systems," May 1986, IEEE Software, pp. 50-58.*

Nenad Medvidovic et al., "A classification and comparison framework for software architecture description languages," 2000, IEEE Transactions on Software Engineering, vol. 26, No. 1, pp. 70-93.*

\* cited by examiner

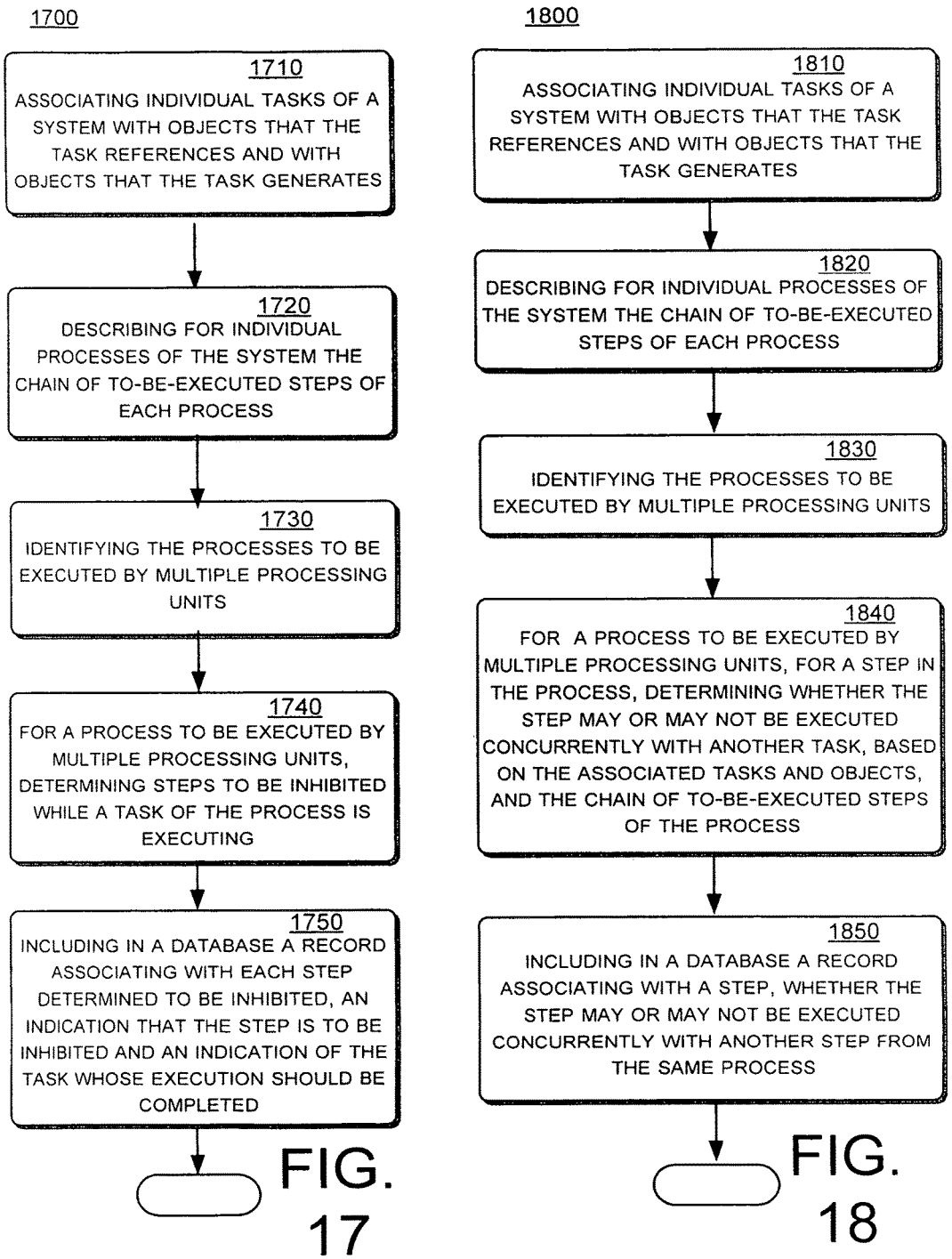

TASKS

|  | 1 | 2 | 3 | 4 | 5 | 6 | 7 |
|---|---|---|---|---|---|---|---|
| 20 | I | O | O |   |   |   |   |
| 21 |   | I | O | O |   |   |   |
| 22 |   | I | O | I | O | O |   |
| 23 |   | I |   |   | O |   |   |
| 24 | I | I | O | O | O |   |   |

OBJECTS

FIG. 19

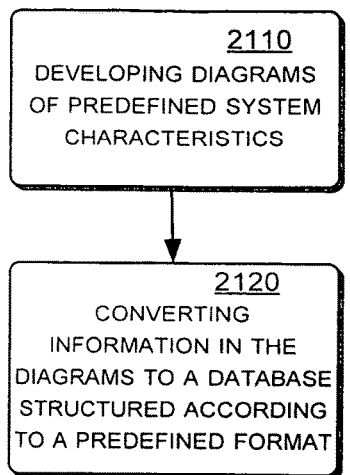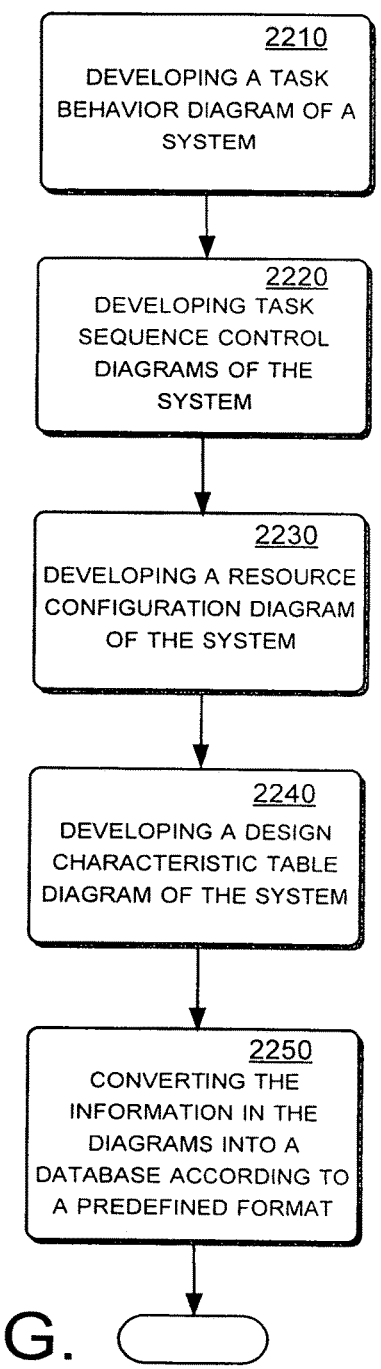
FIG. 21
FIG. 22

DATA INTEGRITY PROTECTION MECHANISM

RELATED APPLICATIONS

This patent application is a continuation of prior U.S. patent application Ser. No. 10/961,434 filed Oct. 7, 2004 now abandoned; to which priority is claimed; and which is herein incorporated by reference in its entirety.

TECHNICAL FIELD

This invention relates generally to a system and method for modeling a system, and more particularly but not exclusively to a system and method for providing data integrity protection to the processes of the system.

BACKGROUND

System modeling is conventionally performed by collecting data thought to describe the system to be modeled, and then representing that data in an ad hoc format. If a simulation or structural analysis of the system is to be performed, a model to perform this analysis or simulation is constructed specifically for the modeled system where a program to perform analysis or simulation is uniquely developed for the system to be modeled, using as variables the collected data on an ad hoc basis. This conventional approach is not only time consuming, but is also so specifically customized to a particular model that change to the system in the process of system development, requires a time consuming re-analysis of the system to be modeled, and a redesign and a re-code of the structural analysis or simulation program.

SUMMARY

Generally and not exclusively, a method and system for providing data integrity protection to the processes of a system is disclosed. The method in an illustrative embodiment includes analyzing a system to determine system information associating individual tasks of the system with objects that the task references and with objects that the task generates, describing for individual processes of the system the chain of to-be-executed steps of each process; and describing physical configuration of the system including an allocation of processes to processors; and determining a data integrity protection mechanism for processes that can execute in multiple processors based on the information. Furthermore in an illustrative embodiment, the described physical configuration of the system includes relative priorities of the processes and preemption data integrity protection mechanisms for processes of the system that execute in only a single processor are determined. Moreover, in an illustrative embodiment, the determined data protection mechanisms are stored in a database along with the system process information, and a routine is configured to execute the processes taking into account the determined data integrity protection mechansisms.

The foregoing and other features of construction and operation of the method, the system, and its elements will be more readily understood and fully appreciated from the following detailed description.

BRIEF DESCRIPTION OF THE FIGURES

Non-limiting and non-exhaustive embodiments are described with reference to the following figures, wherein like reference numerals refer to like parts throughout the various views unless otherwise specified. With regard to the described methods, the order of description should not be construed to imply that these operations are necessarily order dependent.

FIG. 17 is a flow chart of an embodiment of an analysis method to determine steps to be inhibited while a task of a process is executing.

FIG. 18 is a flow chart of an embodiment of an analysis method to determine a step in a process which may be executed concurrently with another step of the process FIG. 19 is an embodiment of a task access matrix for analyzing and comparing the object usage profile of a task.

FIG. 21 is a flow chart of a first embodiment of a method to model a design of a system.

FIG. 22 is a flow chart of a second embodiment of a method to model a design of a system.

DETAILED DESCRIPTION

In the following description, numerous specific details are set forth in order to provide a thorough understanding of the invention. It will be apparent, however that the specific detail need not be employed to practice the present invention. Known structures, elements, methods, actions, and/or other details may not be described in order to avoid obscuring the invention. Moreover, although specific embodiments are described herein, it will be appreciated that these embodiments are illustrative, and that a wide variety of alternate and/or equivalent structures, elements, methods, actions, and/or embodiments may be substituted for the specific embodiments shown and described, without departing from the scope of the invention.

A method of modeling, a modeling system and elements thereof to model the design of a system are described. The method and system may be used for analyzing and simulating the structure and the performance of the system. By the term performance is meant the utilization of at least one of the system's (i.e. of the system being modeled) processing resources; in executing, processing, dispatching, discharging, working out, or the like of the processes of the system being modeled; and/or the time to execute, discharge, transmit, work out, or the like the processes or other measures of responsiveness of the system. The processes of the system are defined below with respect to FIGS. 5, 6, 7, and 8. The resources of the system are defined below with respect of FIGS. 9 and 10.

Figure 1:
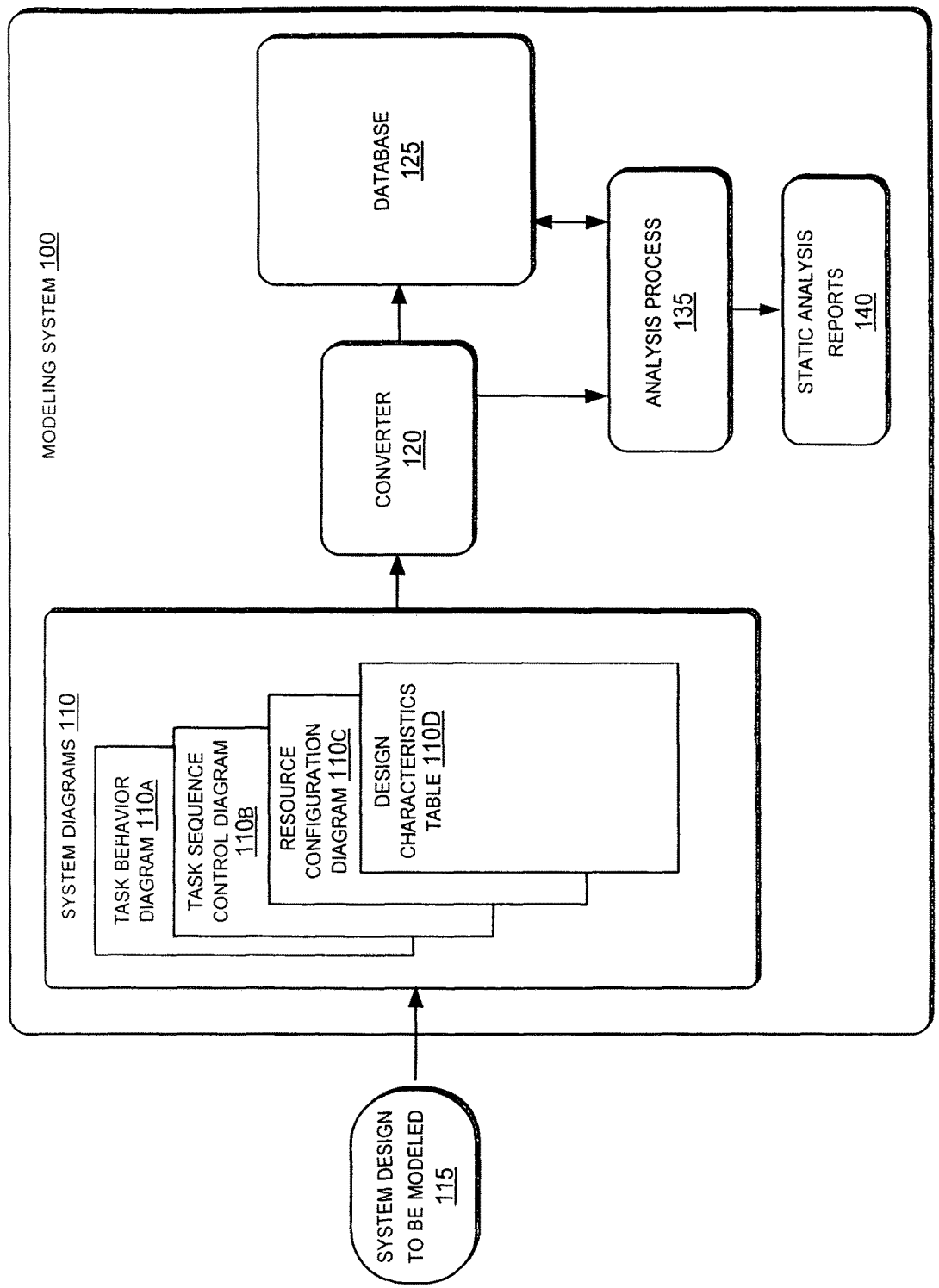
FIG. 1 is a block diagram of an embodiment of a modeling system.

Referring to FIG. 1, there is shown a modeling system 100. The modeling system 100 includes system diagrams 110 that portray at least a portion of the task interactions, the resource couplings, and the control steps of the design of a system 115. In an embodiment, the system diagrams 110 include four separate diagram types that contain separate information about the task interactions, the resource couplings, and the control steps of the design of the system 115. The information described in the diagrams 110 is further described presently.

A first diagram type of the system diagrams 110 may be termed a task behavior diagram 110A. A task behavior diagram 110A associates individual tasks of a system 115 with the objects that the task references, and with the objects that the task generates. The term access is used herein to describe a reference to and/or a generation of an object, and thus illustratively the term accesses describes an action of referencing and/or an action of generating an object. The task behavior diagram 110A is furthermore described presently with reference to FIGS. 2, 3, and 4.

A second diagram type of the system diagrams 110 may be termed a task sequence control diagram 110B. A task sequence control diagram 110B describes for individual processes of the system 115, the chain of to-be-executed steps of a system 115 in response to a trigger condition, including in an embodiment the control logic that determines the sequence of task execution, and including in an embodiment the trigger condition to which the chain of to-be-executed steps is the response. The task sequence control diagram is furthermore described presently with reference to FIGS. 5, 6, 7, and 8.

A third diagram type of the system diagrams 110 may be termed a resource configuration diagram 110C. A resource configuration diagram 110C describes the coupled structures that at least in part execute (process, dispatch, discharge, work out, or the like) the processes of a system 115. The resource configuration diagram is furthermore described presently with reference to FIGS. 9 and 10.

In an embodiment, the system diagrams 110 include a table that may be termed a design characteristics table 110D. The design characteristics table 110D has values of design characteristics of the system 115 affecting the performance and control attributes of the system 115. In embodiments, at least some of the values are also, or are instead, annotated in the task behavior diagram 110A, the task sequence control diagram 110B, and/or the resource configuration diagram 110C. The design characteristics table 110D is further described presently with reference to FIG. 11.

The information about the design of the system 115 contained in the system diagrams 110 may be converted by a converter 120 in operation of the modeling system 100, to a database 125. The database 125 stores a model of the design of the system 115 converted from the system diagrams 110. In an embodiment, the database 125 can be in a predefined format and can include predefined data types so that an analysis process 135, such as an analysis routine that in an embodiment is a standardized analysis routine of the analysis process 135, a standardized simulation routine (not shown) to interpret the encoded model by operating on the database 125. In an embodiment, the database 125 can be used for analyzing the structure of a design of the system 115, by being operated upon by the analysis process 135. In an embodiment, the database 125 can be used for simulating the performance of a design of the system 115, by being operated upon by the simulation. In an embodiment, the database 125 can be used for executing real time control of the model by being operated upon by a standardized executive.

In an embodiment, the modeling system 100 includes an analysis process 135. The analysis process in an embodiment may be implemented as an analysis routine and/or as a manually operated procedure. In an embodiment, the analysis routine is configured to operate upon the converter in deriving a description of the system 115 for analyzing the system 115. In another embodiment, the analysis routine is configured to operate upon the database 125 for analyzing the system 115. Accordingly, FIG. 1 portrays the analysis process 135 as being coupled to both the converter 120 and the database 125. In another embodiment, a human operator may derive information about the system 115 from the diagrams 110, and/or other data describing the system 115, and perform an analysis of the system 115 from the derived information. Moreover, the analysis routine and/or the manual procedure may include into the database 125 data that describes characteristics of objects, tasks, and/or of processes derived from an analysis of the structure of the system 115.

Figure 2:
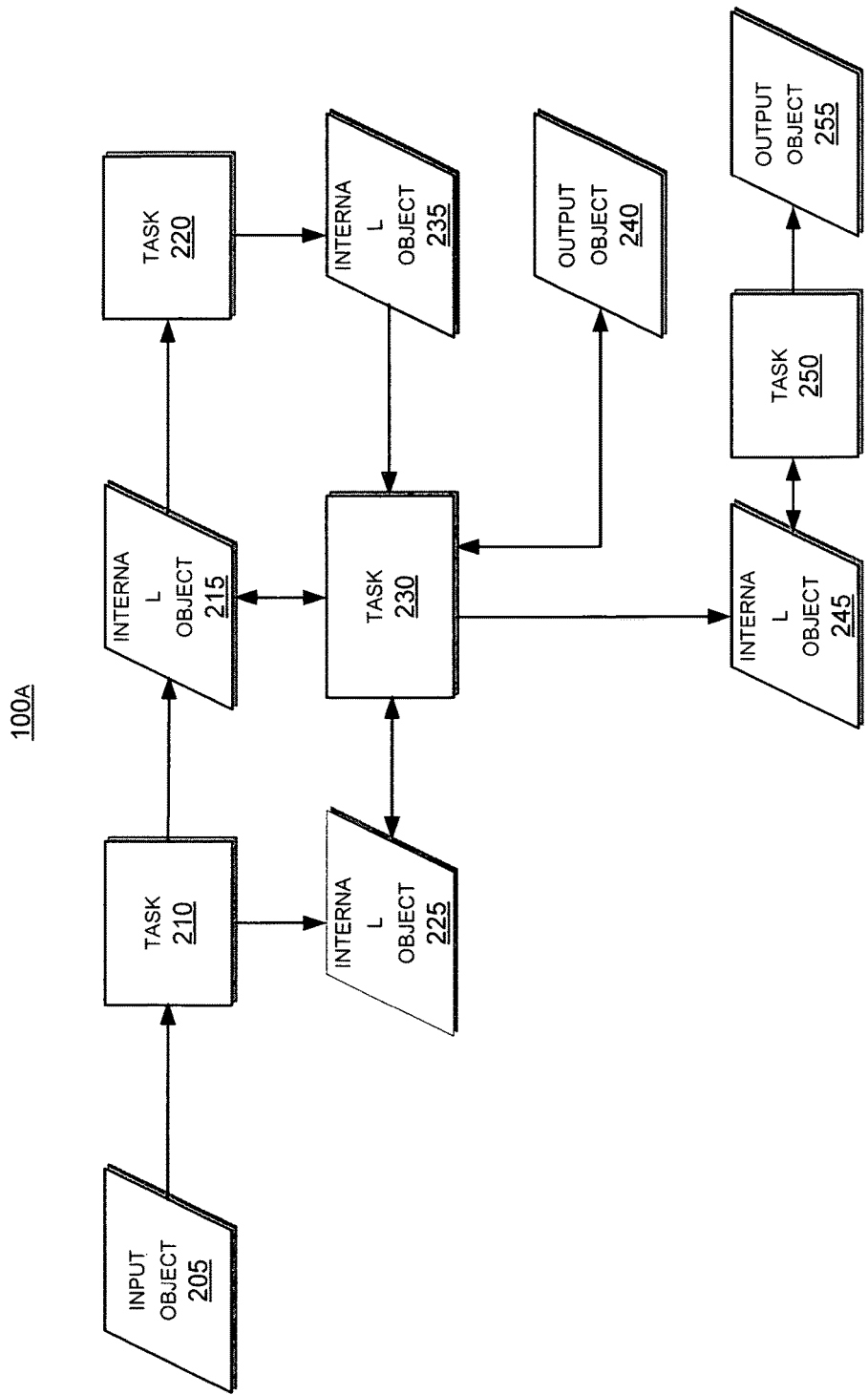
FIG. 2 is an embodiment of an illustrative task behavior diagram configured as an interconnected network of tasks and associated input and output objects.
Figure 3:
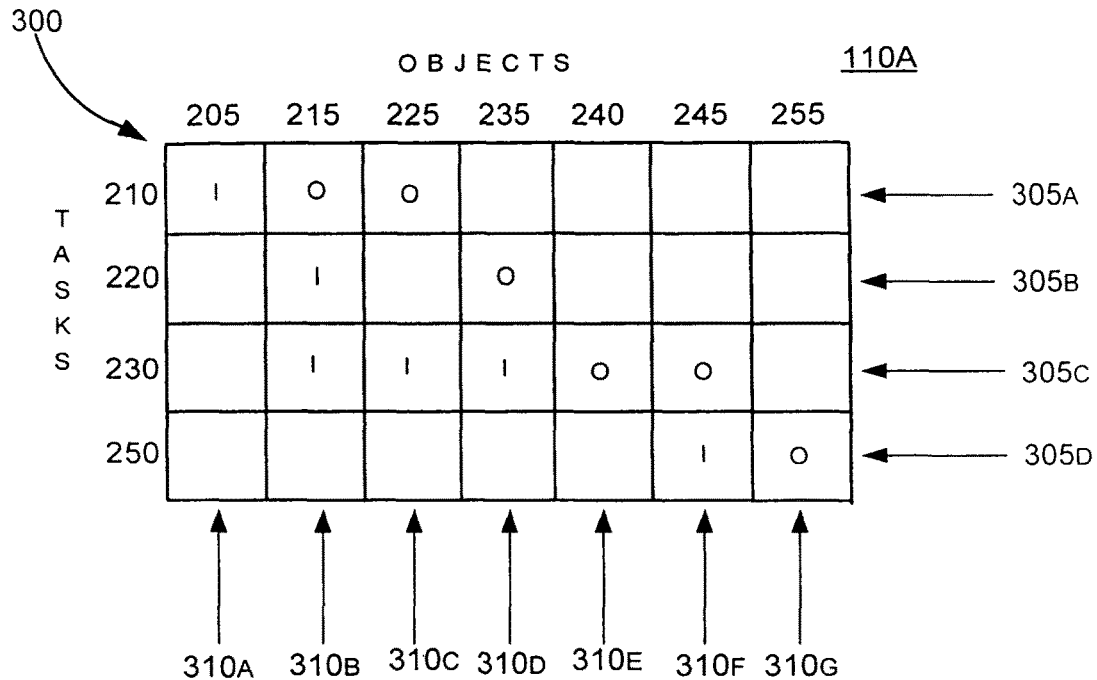
FIG. 3 is an embodiment of an illustrative task behavior diagram embodied as a table.
Figure 4:
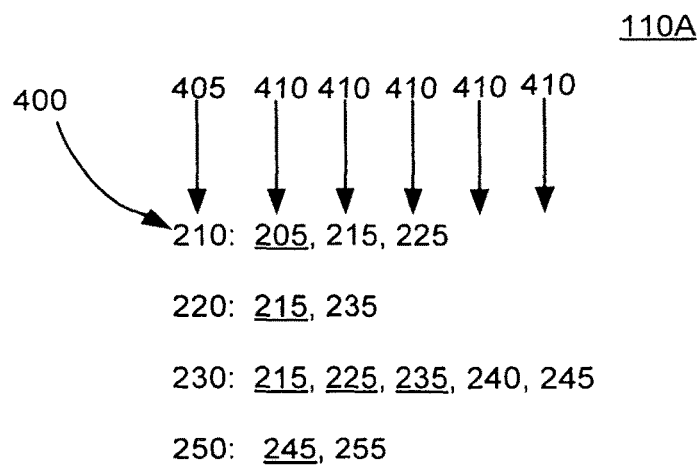
FIG. 4 is an embodiment of an illustrative task behavior diagram embodied as a list.

Referring now to FIGS. 2, 3 and 4, illustrative embodiments of task behavior diagrams 110A are portrayed. A task behavior diagram 110A associates individual tasks of a system 115 with the objects that the task references, and with the objects that the task generates, thus portraying for a system 115 the operational connections between its tasks and objects. A task behavior diagram 110A thus describes for a system 115 the internal object transaction paths from inputs to the system to outputs of the system 115. It is specifically noted that a task behavior diagram 110A can be composed of a hierarchy of sub-task behavior diagrams to simplify the portrayal of a complex system. Here for example, each task in a top-level hierarchical diagram may represent task object relationships portrayed in a lower-level task behavior diagram.

The term task is used herein to mean a constituent of a system that in operation performs work, by transforming zero or more referenced objects into one or more generated objects. Objects can illustratively represent matter or an abstraction.

For instance, in an illustrative system 115 that includes a CPU, a task processed by the CPU comprises program instructions that transform in execution input data objects into generated output data objects. The objects referenced and generated by the task are data objects, wherein the term data may represent the term "data object." In a task processed by a CPU, an object referenced by a task may be termed a read, and an object generated by a task may be termed a write. In the embodiment, an exemplary routine may comprise multiple tasks, and the CPU processes each task by operating upon and generating data objects.

For instance, in one other illustrative system 115 that includes a factory exemplified by a restaurant, a task processed by the restaurant may illustratively compose a restaurant operation, such as transforming a plate from a first position in a cupboard to a second position on a table. The input object in this example is a plate that is positioned in a cupboard and the output object is a plate that is positioned on a table. The task processing unit in this example may be a restaurant employee.

A user is free to define objects of any kind, so a task behavior diagram 110A may include a large number of both tasks and objects. In generating a task behavior diagram 110A, the selection of key object flows will expose the interactions of the system to analysis and simulation after the data of the task behavior diagram 110A is converted into the database 125. Moreover, operational bottlenecks of a system 115 can be represented on task behavior diagrams 110A, to enable the study of root causes and postulate alternate paths for changing their performance and/or structure of the system 115. Parallel paths can represent many approaches to load sharing.

In an embodiment, each task is defined as a functional transform. In an embodiment each task executes in an environment assuring the operational integrity of all objects attached to the task irrespective of concurrent activity within the system. In an embodiment individual tasks do not internally interact with each other except through the interfacing objects and high level controls, e.g. a task does not identify other tasks to be executed within a process. In an embodiment system diagrams indicate control relationships between independent functional tasks based on explicit state information reflecting the effects of task executions. As described with reference to FIG. 5, these controls are exposed in the task sequence control diagram 110B.

With specific reference to FIG. 2, an embodiment of a task behavior diagram 100A of a system 115 portrays a network of connected task-object relationships formed by tasks and their generated and transformed objects. Each portrayed task and object is illustratively represented by interconnected blocks, and an object is connected to at least one task and no other objects, and a task is connected to at least one object and no other tasks. An object generated by one task may be an object transformed by another task. This configuration of the task behavior diagram 100A provides to a user an image of the interconnection between the tasks and objects of a system 115, and the network formed by those interactions, to trace the operational relationship between a task and an object not directly generated by that task.

Each of the portrayed tasks 210, 220, 230, and 250 is illustrative and represents different tasks of a modeled design of a system 115. Each of the portrayed objects 205, 215, 225, 235, 240, 245, 255 is illustrative, and represents different objects of a modeled design of the system 115. A task alternatively transforms an object generated by another task, the object termed an internal object; or transforms an object input to the system termed an input object. A task alternatively generates an internal object; or generates an object not referenced by another task and termed an output object. The input object 205 is transformed by the task 210 into an internal object 215 and an internal object 225, that are each generated by the task 210. Notice that a task may generate more than one object. The internal object 215 is itself referenced by the task 220 to generate the internal object 235. The task 230 references the internal objects 215, 225, and 235 to generate two objects, the output object 240 and the internal object 245. Note that a task may operate upon more than one object, and that an object may be referenced by more than one task. The task 250 references the internal object 245 to generate the output object 255. Note also that in this embodiment, for the internal objects 215, 225 and 235 that are referenced by the task 230, the task 230 and the objects 215, 225 and 235 may also be configured so that the task 230 may generate the object 215, 225, 245 and 240. This is portrayed in FIG. 2 as a double-headed arrow coupling the task 230 to the objects 215, 225, and 240 In a system 115 in which a task is processed by a CPU, a referenced object is to be read by the CPU, and may also be competent to generate (write to) the same object. Similarly, the object 245 which is referenced by the task 250 is illustratively portrayed as also being generated by the task 250, and portrayed as being coupled to the task 250 by a double headed arrow.

Referring to FIG. 3, there is shown another illustrative embodiment of a task behavior diagram 110A is configured as a table 300. The rows 305A, 305B, 305C, and 305D of the table 300 illustratively each represent a different task 210, 220, 230, and 250 respectively of the system design being modeled. The columns 310A, 310B, 310C, 310D, 310E, 310F, and 310G illustratively each represent a different object 205, 215, 225, 235, 240, 245, and 255 of the system design being modeled. Illustratively, a distinctive mark such as an "I" in both a row and a column, represents that for the task represented by the row, the object represented by the column is an object to be referenced by the task, e.g. input to the task. Illustratively, a distinctive mark such an "O" in a row and a column represents that for the task represented by the row, the object represented by the column is an object to be generated by the task, e.g. output by the task. As previously noted, a generated object can also be referenced so an intersecting row and column would show an "O" to imply the double headed arrow designation used in FIG. 2.

Referring to FIG. 4, there is shown another illustrative embodiment of a task behavior diagram 110A configured as a list 400 or an enumeration. Here each task 405 is associated with a sequence of objects 410 that are positioned illustratively to the right of a mark (such as a colon) following the task, and having illustratively a marking such as underlined objects to represent objects that are only referenced by the task, and a marking such as non-underlined objects to represent objects that are generated (and possibly referenced) by the task. As in the other illustrative embodiments of the task behavior diagram 110A diagram, the format and symbology are merely illustrative. For instance, another structure may distinguish between objects that are referenced and objects that are generated, and in fact, the list could associate with a given objects, the tasks that operate upon the object and/or generate the object.

Figure 5:
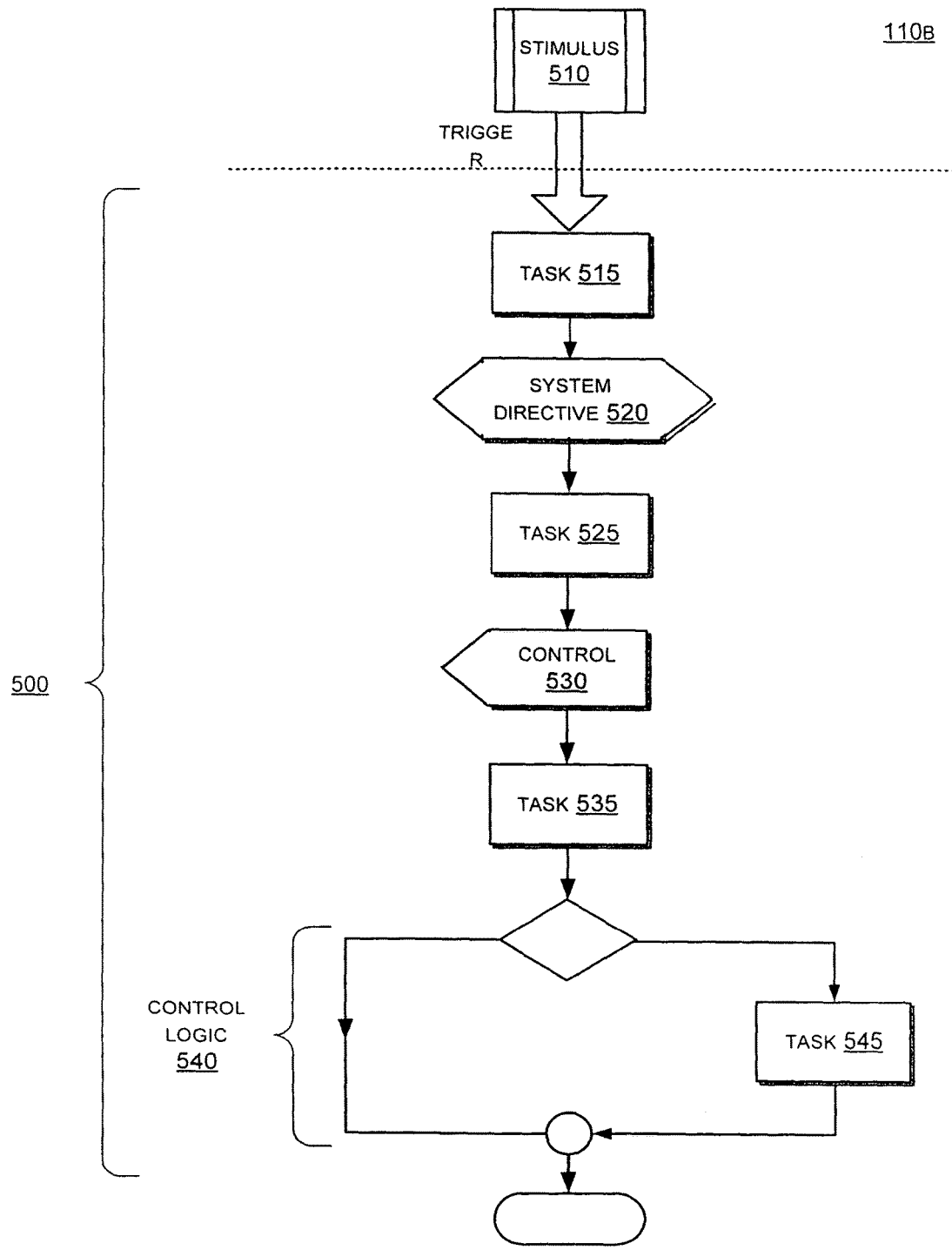
FIG. 5 is an embodiment of an illustrative task sequence control diagram embodied as a flow chart.

FIG. 5 portrays an illustrative embodiment of a task sequence control diagram 110B. While the illustrative embodiment is in the form of a flowchart, other forms are specifically contemplated such as a table and a list or enumeration. A task sequence control diagram 110B describes for individual processes of the system 115, the start condition, and the chain of to-be-executed steps of the process in response to the start condition, including the control logic that determines the sequence of task execution.

The depicted task sequence control diagram 110B has an illustrative chain of steps 500 to represent the response of a system 115 to a specific triggering event 510. The chain of steps 500 is modeled from the system 115. The steps 500 include illustratively tasks 515, 525, 535, and 545; system directives 520; and process control directives 530.

A model of a system 115 may include multiple task sequence control diagrams 110B. Each separate task sequence control diagram 110B portrays the response of the system 115 to a specific triggering event 510 of the system 115. The chain of to-be-executed steps 500 in response to a specific triggering event 510 is termed herein a process. As is to be described with reference to FIG. 9, each node in operation of the system 115 separately processes at least one process, so that a process is processed by only one node. If the response of a system 115 is the same for multiple triggers, then each response may be considered a single process, and may be represented in a common task sequence control diagram 110B. Each task sequence diagram 110B for representing a system 115 is defined independently. More than one process may, in an embodiment of a system 115, include the same task, a task may be a constituent of more than one process. The task sequence control diagrams 110B collectively portray the system's 115 functionality, distributed in response to the totality of triggers. A system's collective processes include the tasks that are portrayed in the task and object relationships of the task behavior diagram 110A.

In an embodiment, a task sequence control diagram 110B includes the triggering conditions that stimulate the response, as well as the response itself. In an embodiment, the triggering conditions are represented in diagrams that are separate from the response diagrams.

The illustrative task sequence control diagram 110B describes an illustrative chain of steps 500 composing a given process, and includes a triggering event stimulus 510. Illustrative triggering events are portrayed with reference to FIGS. 6, 7, and 8.

In response to the triggering event stimulus 510, an illustrative process includes the tasks 515, 525, 535, and 545; the process control step 530; the system directive step 520; and the logic 540.

The task steps have been defined with reference to FIGS. 2, 3, and 4.

Process control steps portray a characteristic of the system 115 in which a process 500 interacts with another process. These interactions include illustratively triggering the other process, suspending the other process, canceling pending triggers, terminating a suspension of the other process, or aborting a process in execution. A process control in an embodiment may be a triggering event of the other process. In such a case, the process control symbol 530 may indicate the other process to be stimulated, and may itself be included with the stimulus (see FIG. 6) as the triggering event 610. Suspend process controls may render a target process to be inactive for a specified time interval. Suspended processes do not initiate additional work steps. Other Process controls can release a suspended process to allow a designated target process to resume executing step activity. A process may suspend itself or another process. Abort is another illustrative process control. The designated target process is commanded to abort its execution after completing the steps already initiated. The next step launched will complete the process and ignore any remaining steps. If the designated target process of the abort control is inactive the process control directive does nothing. Process controls can target any process, including the process execution chain that hosts the process control, allowing a process to manage its own execution by explicitly triggering itself. Trigger controls may incorporate a specific delay to deliver the trigger to the target process at some time in the future. Process controls have attributes identifying a process, termed a target process, and such other attributes as an indication of a specific time delay or count of synchronous signals after which the other process is to be triggered. Process control steps are further described presently with reference to FIG. 6.

System directive steps allow a process (for a system 115 having a CPU) to interact with an operating system. Illustrative system directive step constructs include a request to initiate I/O, a request to backup a dataset (e.g. to copy the content of one dataset into another dataset, to swap the content of two datasets, or to update the content of one dataset from another dataset), and a memory load or save request. The term dataset is used herein to connote a data object as described with reference to FIG. 2. In an embodiment, communication chain constructs are initiated by the I/O step. System directives have attributes specifying the parameters needed to accomplish the request.

Control logic describes a characteristic of the system 115 in which the executing, dispatching, discharging, working out, or the like of constituent tasks is altered according to logical conditions or dependencies. These logical conditions or dependencies control which process steps are executed, in what order, when and under what conditions. Complicated sequence controls are portrayed by nesting fundamental sequence control mechanisms. Illustrative sequence control step constructs that may frequently be implemented by a developer of a sequence control diagram 110B include conditional engagement logic, repetitive engagement logic, and alternation engagement logic.

A conditional engagement logic sequence control step splits a processing thread into multiple separate paths that eventually join on a specific point in the process. Each path allows any number of steps, including additional sequence control structures. Operationally, the value of the control entity changes the response of the process. An example of a conditional engagement logic control structure is an IF directive based upon the value of a specified control entity. Variations of the basic IF directive include OR IF, ELSE IF and IF NOT combinations. A repetitive engagement logic sequence control step describes a control thread segment that contains a number of steps as a block terminated by a specific directive. One illustrative repetitive engagement logic sequence control step includes a LOOP or WHILE repetitive structures which causes a block of steps to be repetitively executed. When the repetition is completed, control passes to the step following the end of the repeated block. Within a repeated block, sequence control directives such as CONTINUE WITH NEXT ITERATION or TERMINATE THIS LOOP transfer execution to the end of the block or to the step following the end of the block effectively skipping the intervening steps. An alternation engagement logic sequence control step describes dividing the control thread into multiple paths that are joined on a specific point in the process. Each of the paths can be populated with any number of process steps of any type in any order. Operationally, the primary path is selected and a control parameter is evaluated to determine how many consecutive times in the future the alternate path will be selected before reselecting the primary path. An example of its use might be to trigger a task every other time a process was triggered. Sequence Control steps have illustrative attributes to define the beginning and end of a block, and to explicitly identify controlling parameters.

In response to the stimulus 510, the task 515 is to be initially executed. After the task 515 is initiated, a system directive 520 is to be executed. After the system directive 520 executes, the task 525 is to be initiated, followed by a process control step 530 and then a task 535 initiates. After the task 535 executes, a sequence control step 540 executes, which illustratively includes an IF construct that conditionally initiates or bypasses the execution of the task 545.

Figure 8:
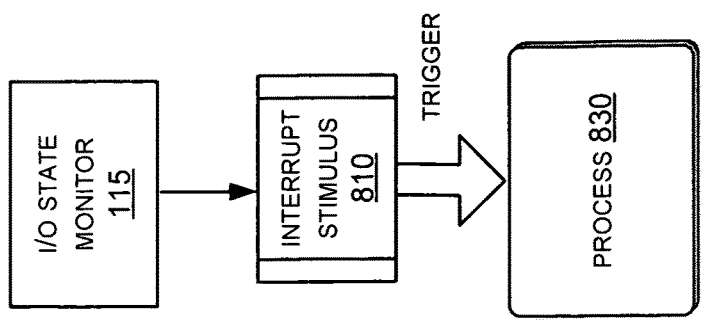
FIG. 8 is an embodiment of an illustrative diagram of an interrupt stimulus to trigger a process, forming a trigger for a task sequence control diagram.
Figure 7:
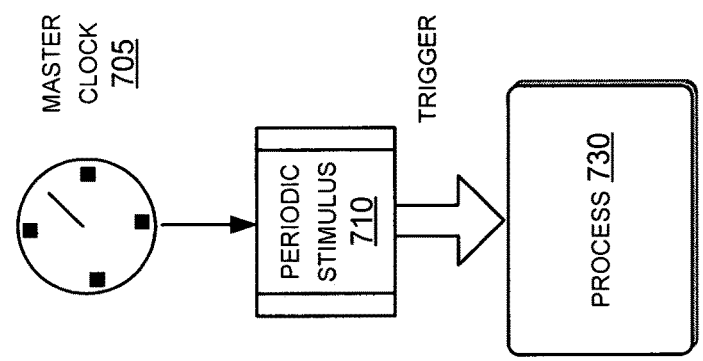
FIG. 7 is an embodiment of an illustrative diagram of a periodic stimulus to trigger a process, forming a trigger for a task sequence control diagram.
Figure 6:
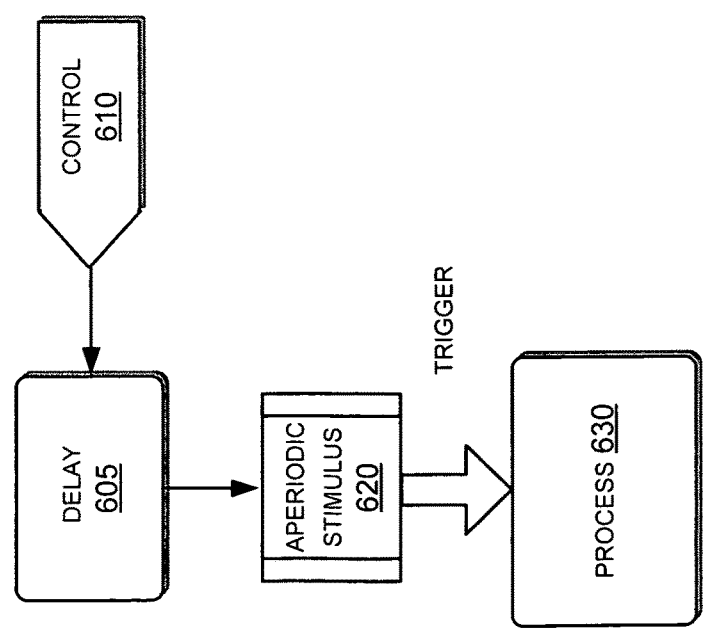
FIG. 6 is an embodiment of an illustrative diagram of an aperiodic stimulus to trigger a process, forming a trigger for a task sequence control diagram.

FIGS. 6, 7, and 8 each portray a model of an illustrative triggering event of a system 115. Referring to FIG. 6, there is shown an aperiodic stimulus 620 for triggering a process 630. Aperiodic triggers are initiated internally in a system 115 by executing explicit trigger controls from within a triggered response. An aperiodic stimulus 620 may be triggered by the process control steps 610 of one or more other processes as described with reference to FIG. 5 with reference to process control step 530. In an embodiment, the trigger may be delayed by a delay 605, such as by placement in a (programmable) time queue. A system's 115 process control steps can illustratively generate or disable process triggers, abort a running process, and initiate or release process suspensions. Complex inter-process trigger constructs can be explicitly constructed from these process controls. Textual comments may describe a specific process control being commanded, e.g. a trigger, a cancel, a suspend, a release, or an abort.

Referring to FIG. 7, a periodic stimulus 710 is portrayed for triggering a process 730 by reference to a synchronizing clock 705. Periodic stimuli are synchronously generated by the passage of fixed time intervals. Synchronous system 115 architectures may be modeled by organizing synchronous work into periodic processes. These synchronously triggered processes maintain their relative phasing, i.e. there is no long term trigger drift because the trigger delays are defined in terms of standard master clock ticks. Textual comments may describe the timing criteria of the periodic stimulus 710.

Referring to FIG. 8, an interrupt stimulus 810 is portrayed for triggering a process 830, indicating that the triggered process is to execute. An interrupt stimulus is initiated by an event external to the system 115.

Figure 9:
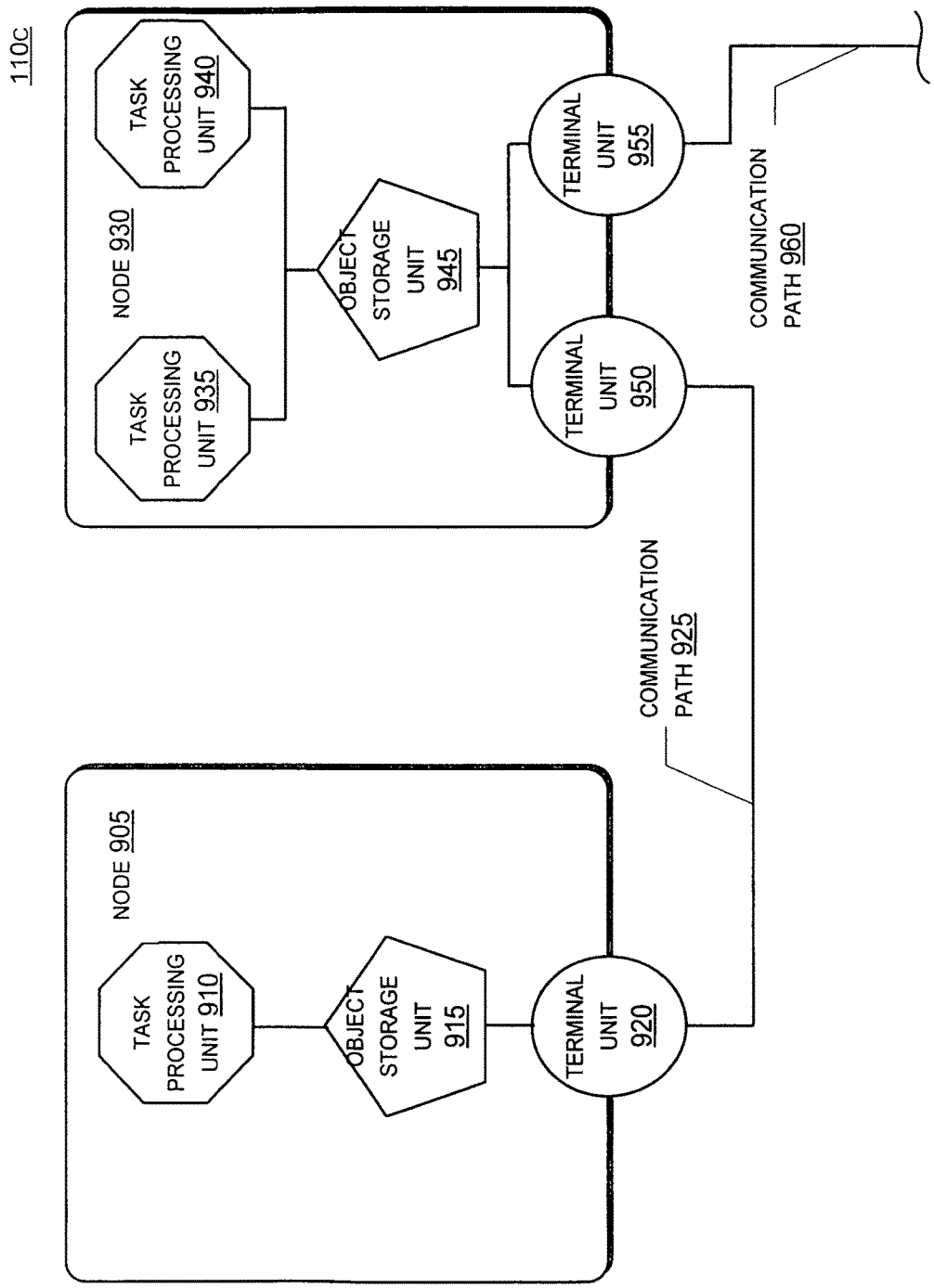
FIG. 9 is an embodiment of an illustrative resource configuration diagram.

Referring now to FIG. 9, there is shown an illustrative resource configuration diagram 110C. While the illustrative embodiment is in the form of a block diagram, other forms are specifically contemplated such as a table and a list or enumeration.

The portrayed resource configuration diagram 110C depicts the modeled resources of a system 115. The resources depicted are those that affect the performance of the modeled system in processing the tasks described in the task behavior diagram 110A. The resource configuration diagram 110C is composed of nodes, here illustratively the nodes 905 and 930. Each node in operation of the system 115 separately processes at least one process of the system 115 as described in the sequence control diagrams 110B.

Each node comprises at least one task processing unit to process (execute, dispatch, discharge, work out, or the like) the tasks of each of the processes allocated to the node, here illustratively depicted in the resource configuration diagram 110C as the task processing unit 910 in the node 905, and the task processing units 935 and 940 in the node 930. A task processing unit has processing attributes that affect the processing performance of its node, generally relating to processing rate and to processing overhead. These attributes are described presently with reference to FIG. 11.

Each node may furthermore comprise at least one object storage unit to store the object that a task in operation generates and/or references, as depicted in the task behavior diagram 110A, here illustratively depicted in the resource configuration diagram 110C as the object storage unit 915 in the node 905, and the object storage unit 945 in the node 930. An object storage unit has processing attributes that characterize the processing performance of its node, generally relating to storage capacity, access rate to put an object into and extract an object from the storage unit, and storage overhead. These attributes are described presently with reference to FIG. 11.

Each node may furthermore comprise at least one terminal unit through which objects pass while moving into and out of the node, here illustratively depicted in the resource configuration diagram 110C as the terminal unit 920 in the node 905, and the terminal units 950 and 955 in the node 930. In the illustrative depiction of the configuration diagram 110C, the terminal units 920, 950, and 955 are depicted as interfacing to an object storage unit of its constituent node. It is specifically understood that in other embodiments, a terminal unit may instead interface with a task processing unit or with another modeled unit, as an aspect of the design of the modeled system 115. A terminal unit has processing attributes that affect the processing performance of its node, generally relating to its accessing/providing of objects from/to the node and/or a coupled communication path. These attributes are described presently with reference to FIG. 11.

Each node may couple to another node, or couple to a unit outside of the modeled system 115 via a communication path, here illustratively depicted as the communication path 925 coupling the node 905 to the node 930, and the communication path 960 coupling the node 930 to a unit outside of the system 115. A communication path couples one terminal unit with other terminal units and/or units external to the modeled system. A communication path has processing attributes that affect the processing performance of the modeled system, generally relating to throughput, transmission protocol, and transmission overhead. These attributes are described presently with reference to FIG. 11.

Figure 10:
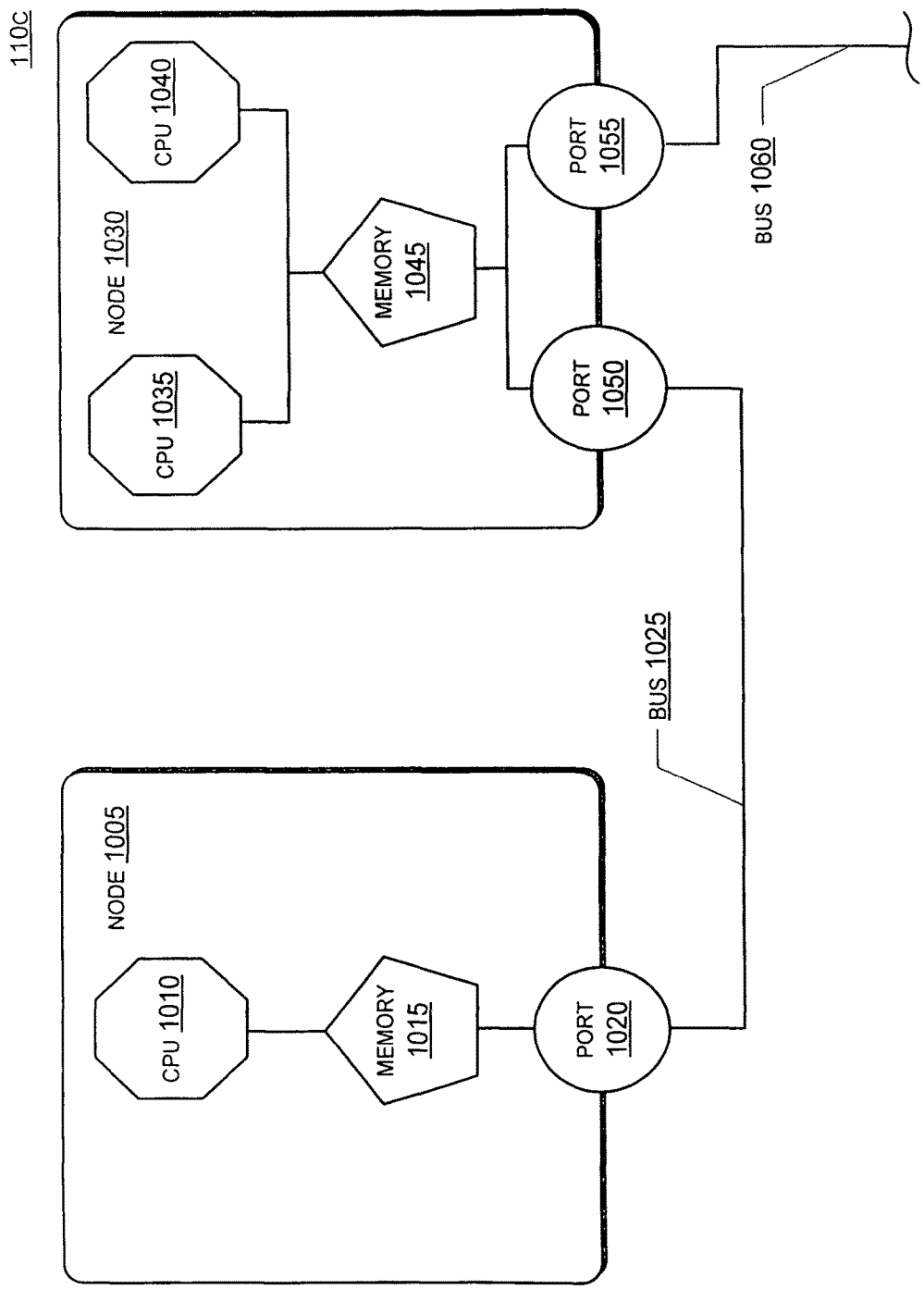
FIG. 10 is an embodiment of an illustrative resource configuration diagram of a computer system.

Referring to FIG. 10, there is shown an illustrative resource configuration diagram 110C for a computer based system 115. The portrayed resources are the resources of a computer system, such that a task processing unit is embodied as a CPU, an object storage unit is embodied as a memory, a terminal unit is embodied as a port, and a communication path is embodied as illustratively a bus. The structure of the resource configuration diagram 110C is illustratively similar to the structure portrayed in FIG. 9. The node 1005 includes the CPU 1010, the memory 1015, and the port 1020. The node 1030 includes the CPUs 1035 and 1040, the memory 1045, and the ports 1050 and 1055. A bus 1025 provides a communication path between the nodes 1005 and 1030. A bus 1060 provides a communication path to a unit outside the system 115. Additional ports (not shown) on other nodes or external to the modeled system could also be attached to bus 1060.

Figure 11:
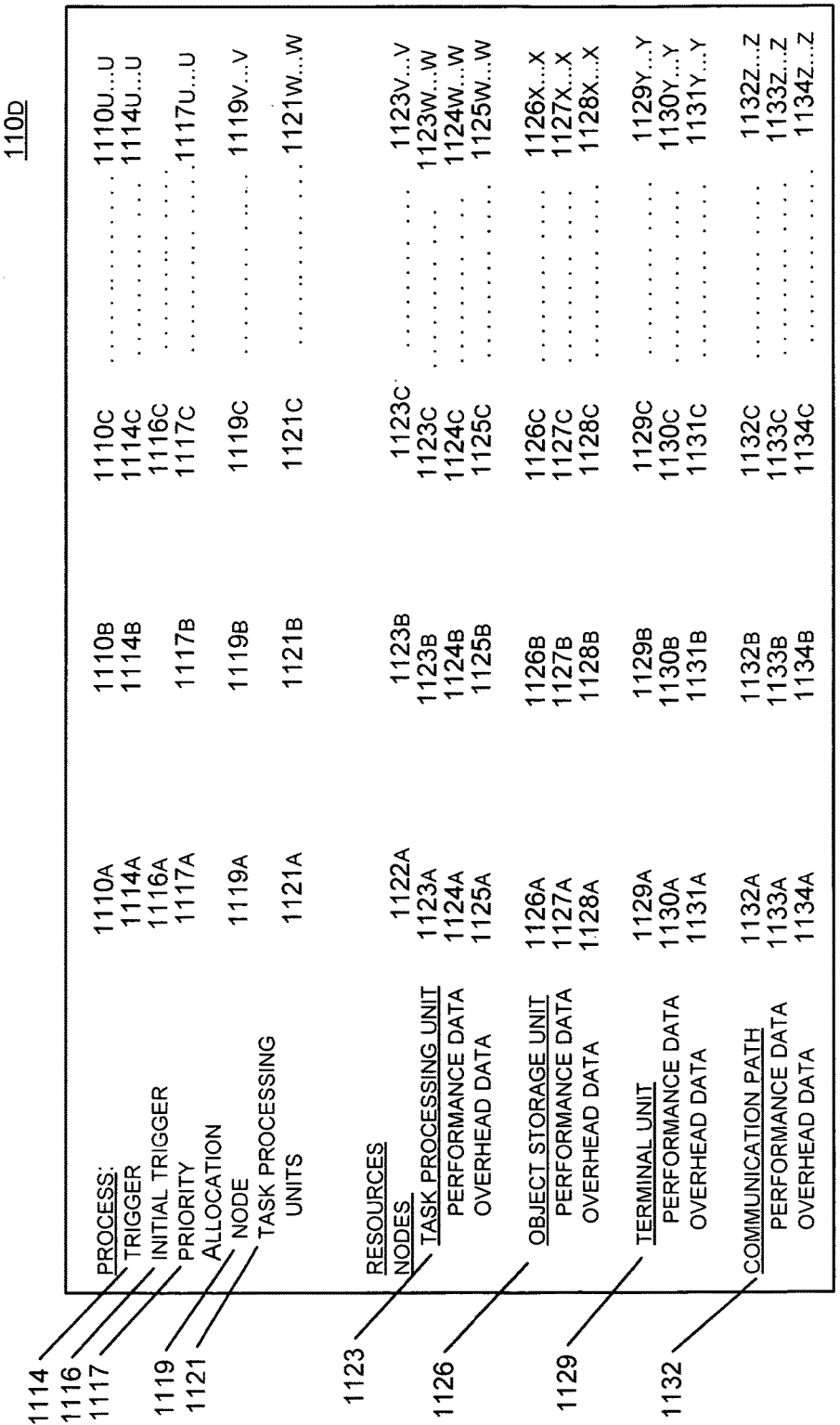
FIG. 11 is an embodiment of the organization of an illustrative design performance characteristics and organization table diagram.

Referring now to FIG. 11, there is shown an illustrative layout of a design characteristics table 110D. The design characteristics table 110D includes exemplary descriptive data of the system 115 being modeled that reflect the performance affecting characteristics and the control characteristics of the system 115. In an embodiment, these characteristics are predefined, so that the data can be operated upon by a standard analysis routine or by a standard simulation routine. In an embodiment, the data is converted into the database 125, which is to have predefined characteristics so that the database 125 can be operated upon by a standard analysis routine or by a standard simulation routine. In this latter embodiment, the characteristics of the design characteristics table 110D are predefined as well.

An embodiment of a design characteristic table 110D is described presently. However, it is understood that in other embodiments, the described data may be distributed in other arrangements of diagrams 110, such as by including some of the data ascribed in this embodiment of the design characteristic table 110D, to other diagrams 110. It is also understood that the depicted described data is exemplary, and that in other embodiments, other data may be depicted. Illustratively, in an embodiment a sequence control diagram 110B may include data indicating a processing performance overhead of the task; such as for a software application or routine, data describing the quantity of operations to be processed in executing the task. Illustratively, in an embodiment a task behavior diagram 110A may include data indicating the physical size of the task; and data indicating the physical size of the object and whether the object is read only or read-write; such as for a software task, data describing the storage requirements of the task and the object. And illustratively, in an embodiment a resource configuration diagram 110C may include data describing the performance capability of the resource; such as for a CPU resource in a data processing system, data indicating the nominal quantity of instructions the CPU executes in a given time, for a digital memory device data indicating the storage capacity of the device, and for a bus data indicating the bandwidth of the bus. Also, it is understood that in other embodiments, another set of data may be used to describe the performance affecting characteristics and control characteristics of the system 115, and the data may be arranged in a different format from that portrayed in the illustrative design characteristics table 110. An embodiment of a design characteristics table 110D includes scheduling characteristics of each process. For each trigger 1114, the trigger source and type may be described. Periodic (or synchronous) processes have periods that are defined by an integral count of synchronous signals, and a wait time for the first trigger. The period and initial triggering condition 1116 may be indicated. Interrupt processes are triggered by specific events. The specific events that stimulate the interrupt may be described. Moreover, for each process, as necessary the initial enable and disable scheduling may be described (e.g. to separate primary processes from backup processes). Generally, in an embodiment each scheduling characteristic may be described in the design characteristics table 110D by a coded expression. Each process 1110A-1110U . . . U is indicated, and for each of the indicated processes 1110A-1110U . . . U, the triggers 1114A-1114U . . . U, and the initial triggers 1116A-1116U . . . U (as present in the system 115) for the indicated processes are indicated.

Described processes are assigned a nominal priority 1117 that describe how resources that execute the processes are allocated to competing processes. The nominal priorities 1117A-1117U . . . U for each process indicate the relative urgency between processes competing for resource allocation. Generally, in an embodiment each priority 1117A-1117U . . . U may be described in the design characteristics table 110D by a coded expression.

Each process is allocated to a node 1119 and to specific task processing unit(s) 1121 in that node. These Task Processing Units execute the tasks of the process. Each processing unit associated with a process is a constituent of the same node. The node for processing each process 1119A-1119U . . . U are indicated in association with the process. The task processing units 1121A-1121U . . . U for processing each process are indicated in association with the process.

Generally, in an embodiment each node 1119A-1119U . . . U and each task processing unit 1121A-1121U . . . U are indicated in association with the process. The task processing units 1123A-1123W . . . W and the nodes 1122A-1122V . . . V may be described in the design characteristics table 110D by coded expressions.

Moreover, a software routine process may have residency designators in the design characteristics table 110D to indicate whether the process or portion of the process is preloaded prior to execution by the system 115.

An embodiment of a design characteristics table 110D includes an indication of each resource unit from the resource configuration diagram 110C, and exemplary indications of the relevant performance characteristics and the processing overhead associated with the resources (if present) for processing a task. Thus illustratively for task processing units 1123, each task processing unit 1123A-1123W . . . W may have associated with it performance characteristic data 1124A-1124W . . . W, and processing overhead characteristic data 1125A-1125W . . . W. The performance capability data 1124A-1124W . . . W and the processing overhead data 1125A-1125W . . . W are indicated in association with the node resource. The performance capability data 1124A-1124W . . . W and the processing overhead data 1125A-1125W . . . W may be described in the design characteristics table 110D by coded expressions.

Illustratively for object storage units 1126, each object storage unit 1126A-1126X . . . X may have associated with it performance capability data 1127A-1127X . . . X, and processing overhead characteristic data 1128A-1128X . . . X. The performance capability data 1127A-1127X . . . X and the processing overhead data 1128A-1128X . . . X are indicated in association with the node resource. The performance capability data 1127A-1127X . . . X and the processing overhead data 1128A-1128X . . . X may be described in the design characteristics table 110D by coded expressions.

Illustratively for terminal units 1129, each terminal unit 1129A-1129Y . . . Y may have associated with it performance capability data 1130A-1130Y . . . Y, and processing overhead data 1131A-1131Y . . . Y. The performance capability data 1130A-1130Y . . . Y and the processing overhead data 1131A-1131Y . . . Y are indicated in association with the node resource. The performance capability data 1130A-1130Y . . . Y and the processing overhead data 1131A-11231Y . . . Y may be described in the design characteristics table 110D by coded expressions.

Illustratively for communication paths 1132, each communication path 1132A-1132Z . . . Z may have associated with it performance capability data 1133A-1133Z . . . Z, and processing overhead data 1134A-1134Z . . . Z. The performance capability data 1133A-1133Z . . . Z and the processing overhead data 1134A-1134Z . . . Z are indicated in association with the communication resource. The performance capability data 1133A-1133Z . . . Z and the processing overhead data 1134A-1134Z . . . Z may be described in the design characteristics table 110D by coded expressions.

In the preceding enumeration of the entities processes, nodes, task processing units, object storage units, terminal units, and communication paths, different symbols U, V, W, X, Y and Z indicate that the quantity of each of these entities may not be identical.

Illustratively, for a task processing unit embodied as a CPU, the performance capability data may include the number of instructions processed or operations performed by the CPU in a time period (e.g. MIPs), and the processing overhead data may include the overhead for synchronous signal interrupt detection and system response, the overhead for external interrupt detection and response, the overhead for switching processing context between processes, the overhead for performing a system control step directive, the overhead for dispatching a user task, the overhead for attaching a dataset argument to a dispatched step, the overhead for locking evaluation (for multiprocessor configurations), the overhead for operating system communications support, the overhead for initiating a bus transmission, the overhead for migrating a bus master between nodes (e.g. target node cost), and the overhead for launching bus transmission, and overhead for launching an acknowledge transmission.

Illustratively, for an object storage unit embodied as a memory, the performance capability data is the overall storage capacity by kind (Read-Only or Read-Write), and the processing overhead data may include aggregate access time, access set-up time, interleaving factors for multiple independent memories and protocol rules for accessing the memory (for integrating multiple CPUs and ports).

Illustratively, for a terminal unit embodied as a port, the performance capability defines the transfer rate into and out of the port. Port transfer characteristics include transfer width (number of bits moved per clock), access lines per block, registered storage size in the port and memory access protocols (e.g. PCI bus transfers). The processing overhead may include access delays, access path arbitration, preemption and error recovery cost expressions.

Illustratively, for a communication path unit embodied as a bus, the performance capability data may be the bandwidth expressed as a byte transmission rate, the packet size (minimum and/or maximum that will determine if the last packet is padded), the time division multiplexed protocol characteristics (e.g. the slot quantity in an epoch, the slot width, and the slots allocated to the bus), the acknowledging characteristics (e.g. response is immediate, queued, or scheduled), the synchronous idle pattern width characteristic data (e.g. the quantity of bytes transmitted in a sync pattern), and the bus protocol characteristic data (e.g. TDMA, USB, or TCP/IP). The processing overhead data may be the overhead for a transmission message header or preamble, the master transfer overhead (e.g. the bus bandwidth lost if the next transmission originates from a different node), the postamble overhead, the command distinction overhead, the acknowledge overhead, the message header and command header overheads (e.g. lumped gap, header, and trailer overhead), the synchronous idle pattern transmission overhead and the temporal delays associated with a network bridge or router.

Figure 12:
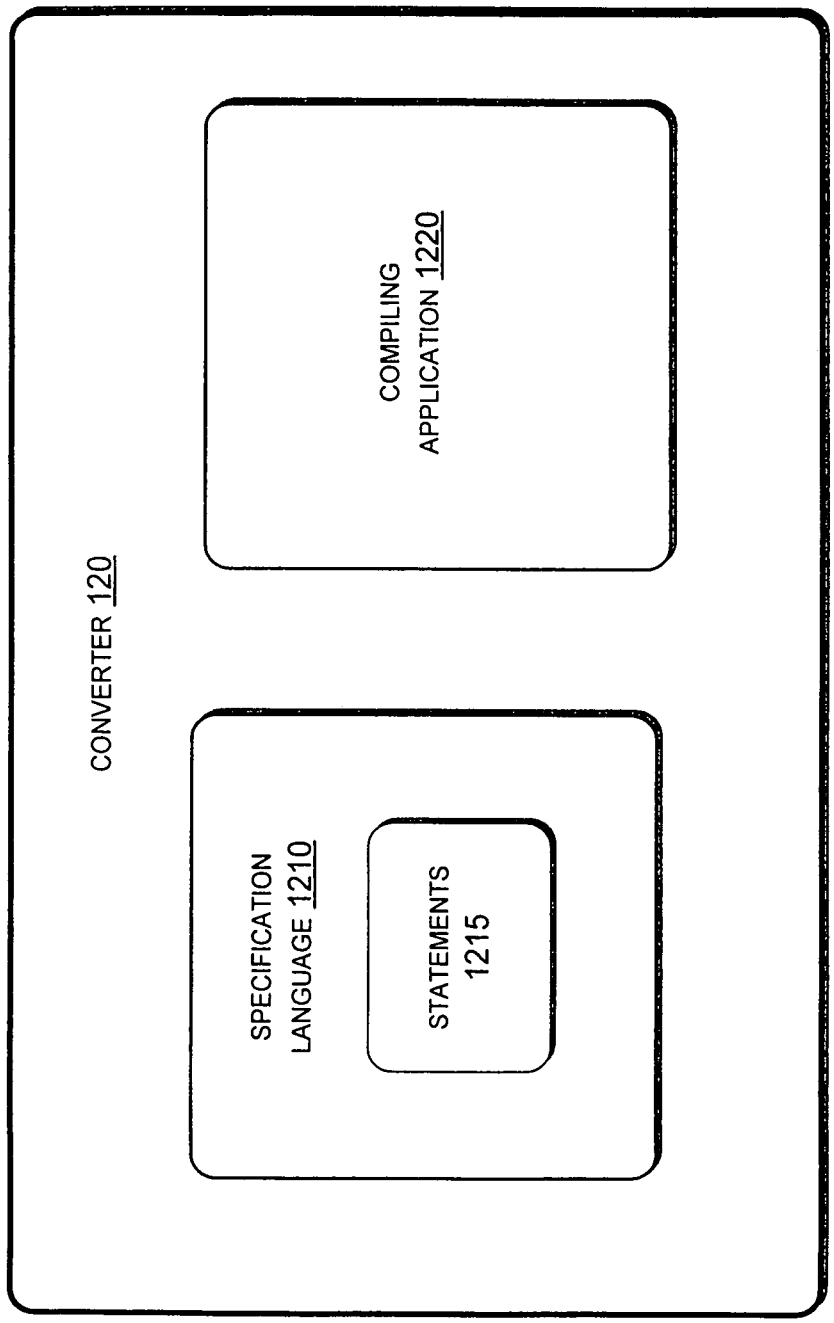
FIG. 12 is a block diagram of an embodiment of a converter to convert system characteristics into a database.

Referring now to FIG. 12, a converter 120 converts in operation of the modeling system 100 the modeled information about the design of the system 115, from the system diagrams 110 to the database 125.

In an embodiment, the converter 120 includes an architecture specification language 1210 for describing the information in diagrams 110 to be stored in the database 125. The architecture specification language 1210 has a vocabulary of multiple predefined different statements, each statement describing an aspect of a system, such as the system's resources, its tasks, its objects, or its processes. For instance, in an embodiment categories of statement types include statements that specify attributes of the tasks described in the task behavior diagram 110A and the design characteristic table 110D; statements that describe the attributes of objects described in the task behavior diagram 110A and the design characteristic table 110D; statements that specify attributes of the system directives, controls, and control logic embedded in the task sequence control diagram 110B; statements that specify the processes defined in the task sequence control diagram 110B; statements that specify the resources modeled in the resource configuration diagram 110C and described in the resource configuration diagram 110C and the design characteristic table 110D; statements that specify how applications map onto resources; and statements that describe how objects move through the modeled system and control options.

Exemplary attributes of statements that specify tasks include the required object accesses (e.g. data referenced and data generated), execution time expressions, and physical size of each task. Exemplary attributes of statements that specify objects include initial conditions of the object (data), structure of the object, format of the object, content limits of the object store, and whether the object is immune to corruption from preemption or parallel accesses during a write access. Exemplary attributes of statements that specify the system directives, controls, and control logic include the sequence of steps composing a process, the triggering of the process, and the end-actions associated with the completion of transmissions requested by the process. Exemplary attributes of statements that describe the resources include task processing unit operational throughput, communication path transmission rate and overhead parameters, object storage unit capacity, access characteristics, and overhead parameters. Exemplary attributes of statements that describe how applications map into resources include how the resources are organized into interconnected nodes including the constituent resources of a node including the allocation of application components (tasks, objects, and processes) to nodes, the linkage of terminal units by communication paths, an identification of logical units with physical units, and how application units compete for resources. Exemplary attributes of statements that describe how objects move through the modeled system include statistical distributions for general assignment expressions, simulation scripts, initial conditions and populations, and utilization evaluation intervals.

In an embodiment, the formal system model architectural specification language is extended from the system structure and component characteristic descriptions to include statements addressing the effect of simulated task execution. The types of simulation effect statements include object flow statements (e.g. source and destination nodes, selection discriminants, movement quantity or likelihood), variable assignment statements (e.g. arithmetic and logical manipulations of simulation and system parameters), and simulation control statements (e.g. initial conditions, stimulating scenarios, run-parameters (e.g. stop time or condition), execution monitors, and interacting probes).

Each statement is defined unambiguously, and structured according to a predefined syntax, so that the statement can be interpreted unambiguously. Each statement illustratively includes two portions, a first portion unambiguously identifying the statement in the vocabulary of possible statements, and a second portion containing the data, attributes or parameters specifically associated with the first portion identification. Moreover, the structure of the statements to specify a system being modeled, has a finite grammar (or syntax), so that the statements can be converted algorithmically into the database 125 by a compiling application 1220 that is aware of the syntax. In an embodiment, system information not specified in the diagrams 110 are given default values in the statements 1215, by default statements and/or by default attribute values. In an embodiment, the compiling application 1220 provides default values for information to be stored in the database 125 beyond that described in the specification language 1210.

In an embodiment, the compiling application 1220 is a programmed computer that in operation executes a compiler routine, to convert the statements of a language description of the system 115 written in the specification language 1210 to a system object code description of the system to be simulated, and/or a description of the to-be-modeled system, in the database 125. In an embodiment, the compiling application 1220 is to decode the statements 1215 and to arrange the resultant object data according to a predefined format for the database 125. In an embodiment, data fields and/or data values not defined by the language statements 1215 are to be given default values in the database 125.

In an embodiment, the semantic content of at least one language statement type is described by the content of the language statement, as well as the position of the language statement in the statements, in the description language 1210. Illustratively, in an embodiment a process statement may include an attribute describing the node associated with the process; and/or a node statement may include as attributes the processes executed in the node. However, alternatively in an embodiment the process statement may not contain information describing its associated node; and the node statement may not contain information describing its associated processes. Instead, the node statement is positioned in a prescribed location relative to the node, thus indicating by that position that it is associated with the node.

Figure 13:
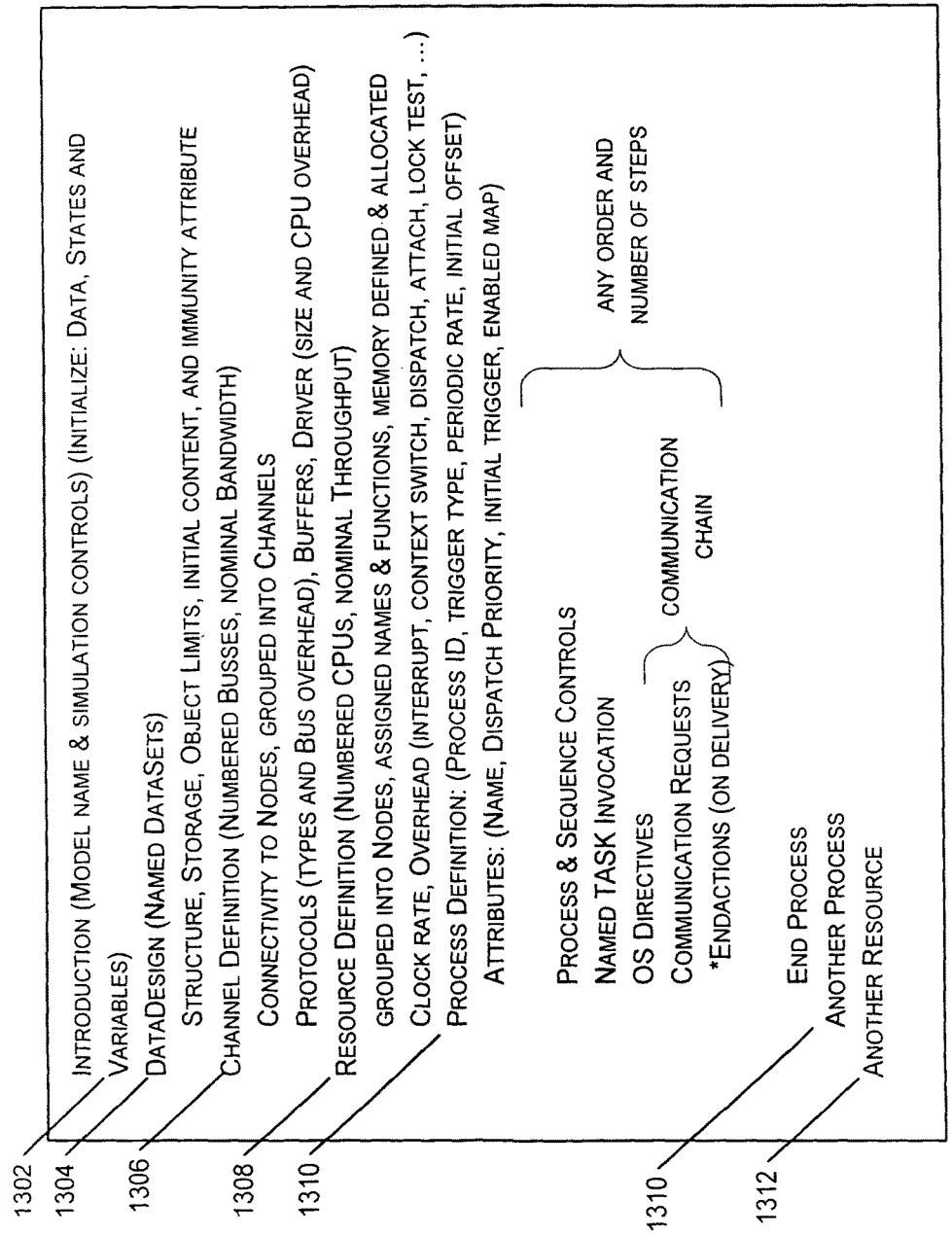
FIG. 13 is an embodiment of a logical organization of a system architectural specification language, in which the semantic content of the specification is dependant upon the position of language statements.

FIG. 13 describes an embodiment in which the position of statements in a language description designates attributes of the system. The portrayed implementation makes use of illustrative language statements. Referring to FIG. 13, line 1302 contains introductory material that includes naming the model and simulation (for a usage in which the model will be used for simulating the system 115). Various simulation controls (e.g. the interval over which resource utilization will be automatically computed and random number seeding) are included. Data states are initialized (objects created and pre-positioned for a simulation run). Variables are assigned parametric values to influence the simulation run.

Lines 1304 describe object (data) design. Selected datasets are defined as containers to hold objects and assigned capacity threshold limits. Data objects (here referred to as members of datasets) are assigned physical storage, organization, layout, packaging, and structural specifications. By default, in an embodiment data sets not explicitly defined have unlimited object storage capacity and occupy no space. Other attributes and initial object populations can be initialized.

Lines 1306 describe communication hardware. Each bus (for an example in which the system 115 is a computer system) is individually specified, assigned a bus identification number and transmission bandwidth. Each bus is attached to specific processing nodes to constitute a network. Busses can be grouped together to form a more reliable channel that dynamically shares the transmission load between member busses. The operational protocol (e.g. TCP/IP or TDMA), and various communication bus overhead parameters are specified (e.g. the inter-message gap and header size). The transmitting node overhead is specified as the work performed by the processor in initiating a transmission. The size of supporting communication buffers and port drivers can be specified.

Lines 1308 describe a resource which in an embodiment is the processing hardware. Each CPU is assigned an identification number and nominal throughput capability. These processing resources can be grouped into nodes and assigned names and functions. A master clock period establishes the synchronization signal rate and various processing overhead cost can be specified.

Lines 1310 describe processes under a processing unit (CPU). Thus, each of these indented process definition statement groupings also by virtue of their position are associated with the CPU described in lines 1308. It is understood that these groupings, while able to imply attributes not specifically described in a statement, are also intuitively more easy to construct, as well as convert to the database 125. The process is automatically allocated to the preceding resource and may be enabled to execute in additional CPUs within the same node. Any number of processes 1310 can be specified under a processing unit (CPU). Each process is assigned a unique identifying number and specifies the trigger type: interrupt, aperiodic and periodic with a fixed period and initial phasing specified in number of sync signals. A process can be assigned priority, name, function, initial trigger time, and map of CPUs in this node that may assist in executing steps from this process. In the organization of the language specification portrayed, the processes specified following a CPU resource are authorized to execute on that processing resource.

System service requests are single sentence directives (e.g. dataset backup copy).

Communication request specifications begin with a Send, Command or Broadcast Request directive that names the payload block to be transmitted and identifies the channel to which the request will be directed. An optional destination process can be appended to the communication request differentiating between directed (Send) and multicast (Broadcast) requests. Attributes include transmission priority and dataset read (source of the transmission data). Any number of payload-length directives are concatenated to express the size of the communication request. Behavior directives can be included to model object flows and instrumentation associated with modeling the effects of the transmission.

End-actions are specified inline, immediately following the communication request that will eventually trigger the end-action in another node. End-action options include Forward directives to pass the transmission onto another bus (e.g. over a bridge), process controls, and additional Communication requests.

Line 1312 references that other resources if any are to be specified in line after the last process allocated to the above resource 1308. Thus, each of these indented resource definition statement groupings also by virtue of their position is associated with the model name.

Figure 14:
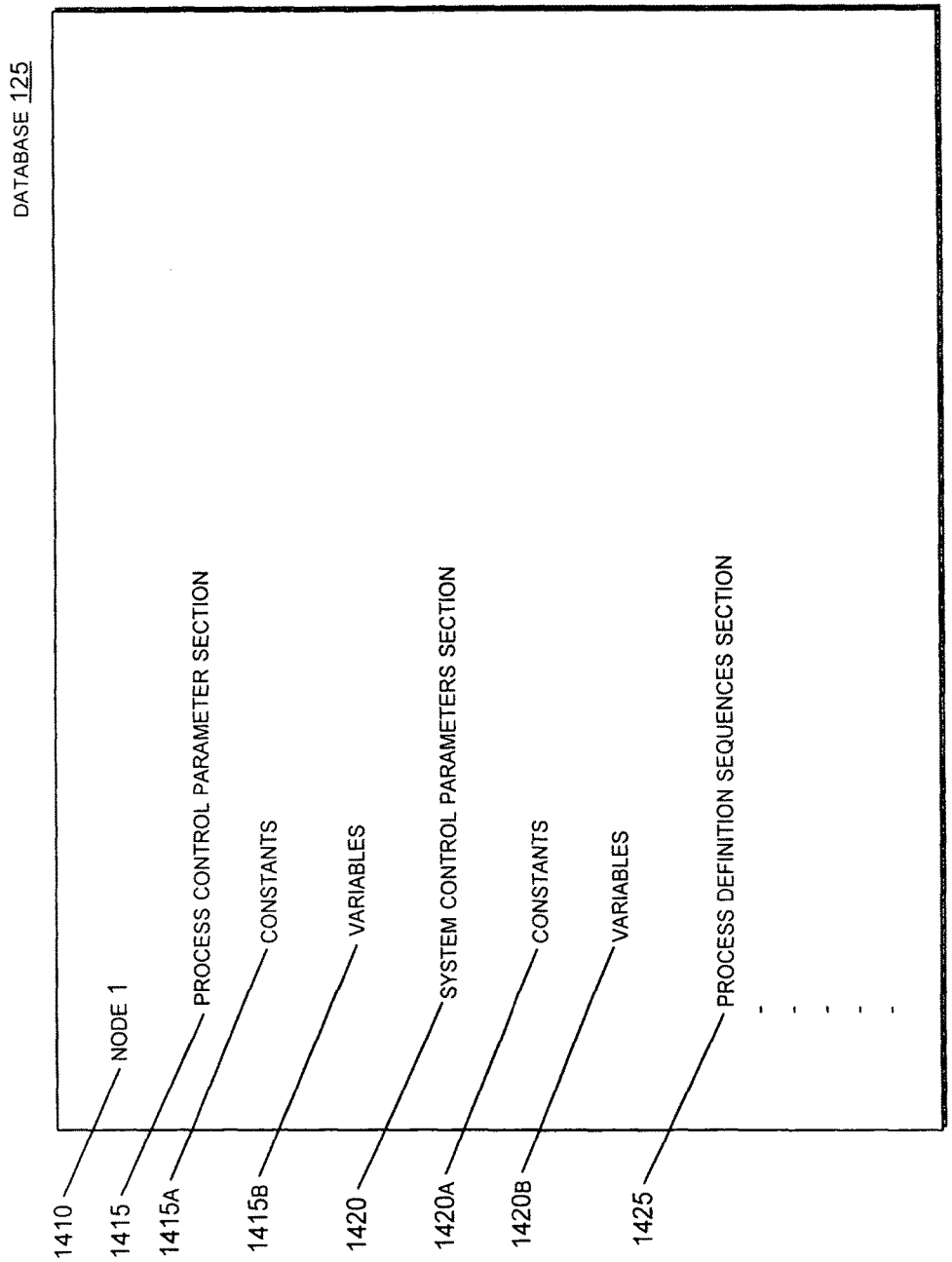
FIG. 14 is an embodiment of a database for storing a model of a system.

The database 125 stores a model of the design of the system 115 that is converted from the system diagrams 110. The database 125 stores process characteristics and structural characteristics of the system resources relevant to performance. In an embodiment, the database 125 can be in a predefined format and can include predefined data types. Referring to FIG. 14, one illustrative embodiment of the database 125 includes a structure for each processing node 1410. The structure for only one node is illustratively portrayed in FIG. 14. The illustrative database 125 is partitioned into sections termed a process control parameters section 1415, a system control parameters 1420 section and a process definition sequences 1425 section.

The process control scheduling parameters 1415 address the scheduling data for the node for managing the process execution of the node. The scheduling data include constants 1415A (e.g. triggers, priorities, maps, links, and initial conditions), and variables 1415B that may be used by an application that accesses the database 125 in such an embodiment (e.g. a performance application in which case the variables may include scheduling workspace and progress pointers) and such control parameter variables as status indicators.

The system control parameters 1420 address the management of system resources as applied to the processes allocated to this node. The system control data include constants 1420A (e.g. resource unit characteristics and initialization data), and variables 1420B that may be used by an application that accesses the database 125 in such an embodiment (e.g. node and resource status).

The process definition sequences 1425 describe the sequence of step executions defining the process' response (e.g. an ordered list of the steps composing each process). This data will be of variable length because a process may be composed of any number of steps in any order to accomplish the intended operational function. A process end may be indicated by an end of process indication. The kinds of steps may be indicated by a characteristic encoded format. Each step may contain multiple fields to indicate the arguments of a step, the last field may be a delimiter indication. Sequence control steps in an embodiment manipulate a progress pointer for a process, used by a simulation application in emulating the performance of the system. A node having multiple multitask processing units may have additional structure to store multitask processing unit relationships such as in a multi-CPU node system embodiment, step dependency and dataset lock controls.

What follows is an exemplary listing of predefined resource characteristics pertinent illustratively to a simulation of a computing system, that may commonly be extracted from a system to be simulated and put into the database 125. These characteristics are to be illustratively contained in the system diagrams 110. In the development of the database 125 contents, data not specifically provided is given a default value. In an embodiment, the database 125 can be used for analyzing the structure of a design of the system 115, by being operated upon by the analysis routine. In an embodiment, the database 125 can be used for simulating the performance of a design of the system 115, by being operated upon by the simulation routine. Fewer system characteristics in the database 125 may enable a simulation having less fidelity, because certain characteristics of the system will not be accurately accounted for in the simulation.

In an embodiment, the database 125 for a node contains three types of information. Structural characteristics specify the organization and physical relationships between the components that constitute the node. Operational characteristics specify the dynamics that control the behavior of the system as interacting component parameters. Performance characteristics specify the temporal capability and overhead costs of each component, and in an embodiment include behavioral attributes.

Each node of the system to be simulated has what are termed herein structural characteristics that define its constituent resources. Illustratively, for a computing system, these structural characteristics include processors, memory, and ports. Operational characteristics define the triggering conditions for each process. Illustratively, interrupt triggers are caused by external events, periodic triggers are fired at predefined synchronous intervals, and aperiodic triggers are initiated from within a process.

For a CPU, in an embodiment the CPU's structural characteristics include the hosting node, attached memory and available ports. For a CPU, in an embodiment the CPU's operational characteristics include the synchronization (sync.) signal rate or generator and associations of external events to processes. For a CPU, in an embodiment the CPU's performance characteristics include overhead for context switching (changing CPU execution focus from one process to another process), for task dispatching (the cost to launch a task within a process), for control step execution (the control processing overhead to execute a control directive or system control step), the throughput (expressed illustratively as operations performed/second), I/O interrupt processing time overhead. Task, and multiprocessing characteristics e.g. the cost (CPU time or operations performed) to test a dataset read/write lock, cost to set a dataset read/write lock, and cost to unlock (i.e. back out a lock setting) for a dataset read/write lock.

For a memory, in an embodiment the performance characteristics are storage capacity, transfer rate overhead, transfer rate, and sizes of each storage module managed. The system memory characteristics include the physical storage size of every module in a node and the dynamic location assigned to each. Modules that are designated as permanently resident (i.e. loaded once and never unloaded) are listed. The structure of the memory is specified as an amount of ROM and of RAM that is physically available, Memory that is reserved for the operating system including routines, buffers and workspace.

For a port, in an embodiment, the port's structural characteristic is its maximum bandwidth expressed illustratively as bytes moved per second and the physical transfer word width expressed in data bits transferred in parallel and blocking (size of each transfer line). Internal port buffering defines the memory blocking and determines the maximum sustainable transfer rate. Access rules define how the port competes with other memory users (CPUs and ports) for physical access.

For a communication path (commonly a bus), in an embodiment the communication path's structural characteristics define the physical nodes to which it is attached and the physical transfer word width expressed in data bits transferred in parallel. For a bus, in an embodiment the bus's performance characteristics are its transfer rate (expressed illustratively as bandwidth) and its transmission buffer sizes. Bus operational characteristics include protocol parameters e.g. packet size limits (maximum and minimum), preamble and postamble overhead costs expressed in time to transfer a given data quantity.

Operational characteristics include the costs to move a transmitter from one node to another node. Synchronous buses are defined illustratively by the characteristics of the idle pattern sent. The CPU overhead cost to initiate a transmission (if any) is characterized, and illustratively collision protocols (e.g. TCP/IP) are defined parametrically by the collision detection overhead and the resolution overhead, such as the time interval where the bus resolves contention and does not transmit payload. Some buses (e.g. Mil Std. 1553 bus) differentiate between messages and commands so both are defined illustratively by preamble and postamble parameters characteristics. Some buses are based on time division multiplexing. These are illustratively defined by the total number of allocation slots in a full epoch cycle and by the physical size of each slot. Each slot may be considered as a separate bus with a full bandwidth but available only periodically for a single slot time. The specific time slot assignment is an operational characteristic for the bus. Other bus characteristics defined include the size of the physical memory module containing the bus controller function code and memory reserved for buffering requested messages in a node.

The predefined characteristics of the system that are to be stored in the database 125 may include data describing the process(es) executed by each node, and each process step. A task may be a constituent of more than one process and may appear multiple times in a process as different steps. Each task instance is characterized independently. For a process, in an embodiment the process' defined structural characteristics include relative priority, initial state, first trigger, execution steps including user tasks, suspends & resumes, triggers, aborts and ends, conditionals (ifs), repetitions (loops/whiles), alternations (everys), else and terminate options, I/O requests and end-actions, dataset backups (e.g. copies and swaps) and module saves and loads. Process characteristics also describe periodic trigger intervals and initial phasing offsets for periodic processes. These are illustratively expressed as counts of synchronization (sync) signals.

Process operating characteristics described include the maximum depth of the process trigger queue, e.g. an identification of waiting triggers that are postponed until the current execution of a previously triggered process competes. The aggregate scratch workspace is computed in an embodiment of the converter 120 to represent data space needed to hold temporary data, e.g. stacks used while the process executes.

For a process, in an embodiment the process's defined performance characteristics are its allocation (its CPU allocation run map), trigger events, and the location of its component modules. For a task instance, in an embodiment, the task's structural characteristics are its preemption ceiling and, in multiprocessor nodes, inhibits due to locks and dependencies. For a task, in an embodiment the task's performance characteristics are its physical size, per instance run-time expression and workspace (including stack and temporary storage), object flows, interrupt generation, variable assignment, and instrumentation recording variables and measurements associated with the actions of the task model.

The predefined characteristics of the system that are to be stored in the database 125 also include data describing the data sets accessed by process steps. For a data set, in an embodiment the data set's structural characteristic include system protections required to maintain data integrity with multiple accesses, and in an embodiment the performance characteristics are the physical size of the data set, and residency and initial location of the data set. The object's format and initial state may be specified.

The output from the predefined system characteristics stored in the database 125 also includes data describing the messages transmittable from one node to another on each bus. For a transmission, in an embodiment the transmission's structural characteristic are its process request step information, its transmission priority, its message type (command or message), its destination node or broadcast (simulcast) indicator, its forwarding (bridging), and its end-action options including: trigger, abort, resume, and additional requested transmissions. For a transmission, in an embodiment the transmission's performance characteristic are it payload size, an identification of the bus used, an identification of the transmitting CPU effected, an identification of the launch node, its request backlog and the buffering to be applied. In an embodiment this information is compiled into an integrated message catalog for the system.

In an embodiment, the database 125 entries map external events to interrupt triggers for specific processes. Other database entries define the synchronous triggers as a count of sync signals for establishing fixed intervals for periodic processes. The database 125 entries also define initial triggers and relative priorities for each process and identifies the processors allocated to execute each process. The database 125 entries describe the initial conditions for all components.

The database 125 also maintains operational status throughout a simulation or actual real-time execution. Each process has a progress pointer identifying the next step to be launched and a suspension counter maintaining the number of sync signals remaining until the process' suspension expires. The database 125 maintains various operational parameters such as loop counts, preemption stacks, trigger queues, instrumentation statistics, object repositories and delay chains.

All the particular steps defining each process are encoded in the database. There are four kinds of steps: user tasks that represent useful work, sequence control steps that alter the linear execution order of steps within the process, process control steps that manipulate the triggering, suspension, and ending of processes and the fourth category called system controls that request I/O transactions, backup dataset content and load and save modules between memory and backing store.

FIGS. 14, 15, 16, 17, and 18 describe illustrative methods and structures for providing data integrity to task execution of a system 115, and/or its modeled simulated execution. The methods provide data integrity by analyzing object-task relationships and the chain of execution of system 115 processes. The determined methods and structures provide data integrity by altering task execution and object access by controls outside the tasks. A task according to the described methods need not be altered. The methods are determined outside of a task by analyzing the object-task relationships and the chain of execution steps of the processes. The illustrative methods insert controls to inhibit hazards from compromising valid execution. Controls imposed at the process step level can be implemented outside the task and dataset components. Advantages of this approach includes determinism, i.e. the execution characteristics of the actual tasks are independent of the competing processes and complexity of the dynamic shared objects, and independence, i.e. the tasks and data are implemented without concern for concurrent system activity.

These data integrity protection methods are to determine task preemption levels, to determine a task to be inhibited from executing, to determine a step that may be executed concurrently or may not be executed concurrently with other steps, to determine if an object is to have a lock, and to determine the lock to be accessed by the step. The structures provide a record in the database 125 to indicate the task preemption levels, tasks to be inhibited, steps to be run or to not be run concurrently with other steps, and steps that access locked objects and the locked objects accessed by the process steps.

Figure 15:
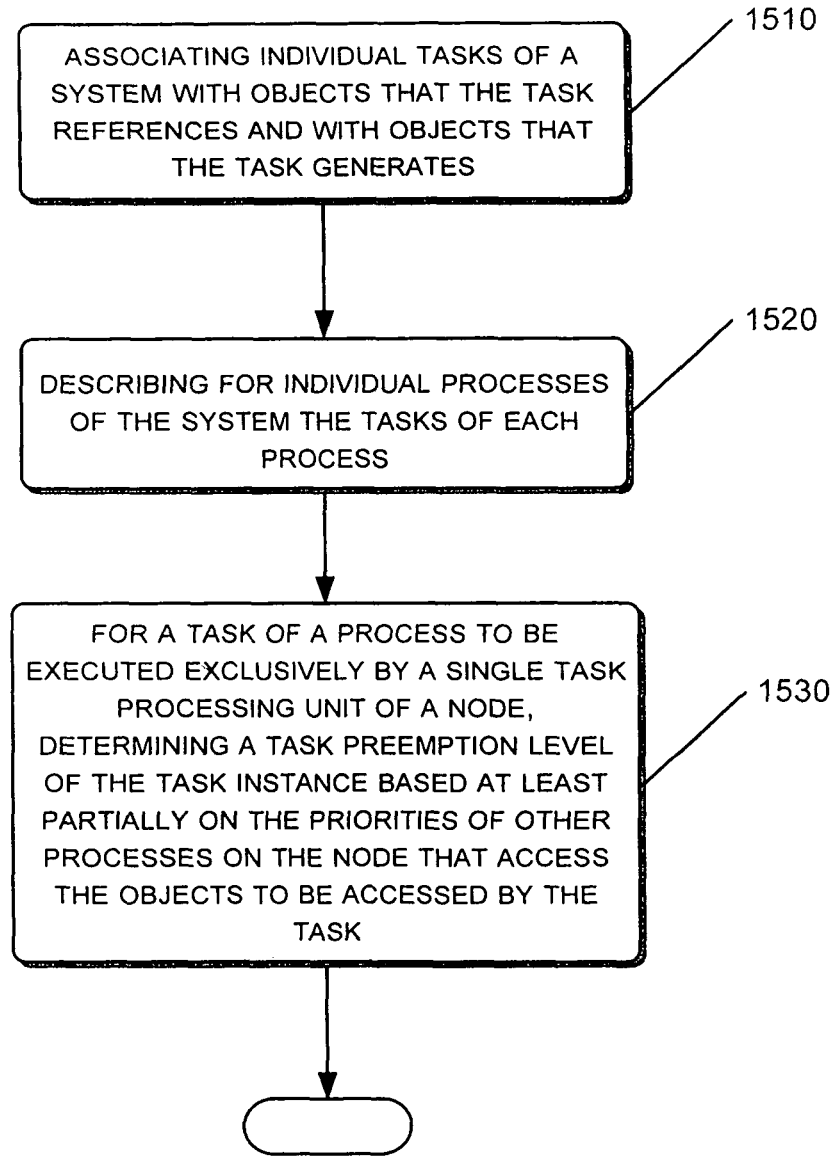
FIG. 15 is a flow chart of a first embodiment of an analysis method to assign a preemption level to an instance of a task in a process of a system.
Figure 16:
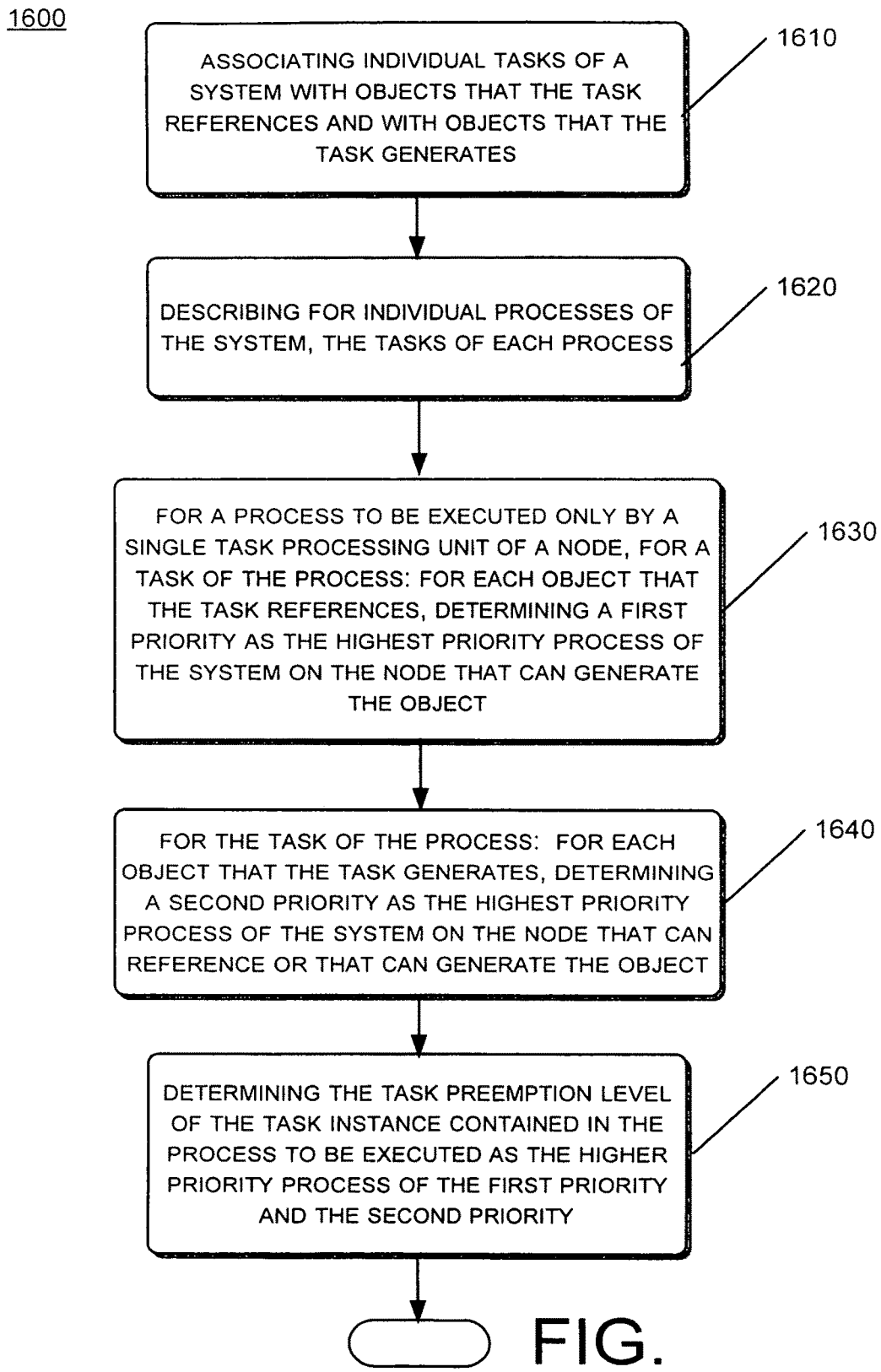
FIG. 16 is a flow chart of a second embodiment of an analysis method to assign a preemption level to an instance of a task in a process of a system.

FIGS. 15 and 16 each portray an embodiment of a method of the analysis process 135 for providing data integrity to processes executed exclusively by a single (i.e. a unitary quantity of) task processing unit of the system 115. The method provides data integrity by assigning individual preemption levels to each task instance in the system. The method inhibits preemption of non task steps to avoid system control instability. The method assigns task preemption levels by determining the task preemption levels based on an analysis of the system model. Task preemption is a phenomenon in which a more urgent process interrupts a less urgent (lower priority) process. A single processing unit node, where only one processing unit task stream is to be managed, may have data hazards resulting from preemption. Objects being accessed by the preempted task are vulnerable if some step in a preempting process accesses the same object, and at least one of the accesses can generate the object (e.g. change the object). An elevated preemption ceiling for the lower priority task postpones preemption from higher priority processes until the lower priority task completes its execution. This dynamic blocking inhibits preemption by the more urgent process while a potential data integrity hazard condition exists. The preemption block lasts until the lower priority task with the elevated preemption ceiling completes. Preemption by more urgent work with priority above the elevated ceiling is allowed but the consequences will not constitute a data integrity hazard with the preempted task.

In this discussion, preemption occurs when a triggered process has a higher priority (is more urgent) than the task currently in execution causing the task in execution to be interrupted at this point in time and the processing resource immediately assigned to the higher priority preempting process. If the newly triggered process has a priority equal to the currently executing task no preemption will occur because processes with equal priority compete in trigger order, i.e. the effective process priority uses the time since last triggered or released from suspension to resolve contention between processes with equal priority values assigned. Because the process from which the currently executing task was triggered some time ago it will be given preference over a newly triggered or released process with equal or lower priority. Such newly triggered or released processes shall wait until the current process completes or is suspended before being serviced.

Analysis of a model's structure identifies possible combinations that could cause preemption hazards. The methods are applicable to a process to be executed by a single quantity of task processing units. In a single task processing unit node, analysis of the preemption risk is conducted for a task by considering at least the global objects that are accessed by the task. A global object is an object that some step can generate and is accessed by steps from processes with differing priorities (otherwise preemption would not occur). Promoting a user task's preemption priority ceiling to block all preemption (i.e. a critical section) would insure object integrity but would unnecessarily delay preemption from more urgent processes that do not access the same object(s). Promotion need not be raised to the critical section level if a lesser value would suffice. Values less restrictive than a critical section can be determined to block all preemption from processes that could corrupt an object accessed from multiple processes.

If a preemption hazard is possible (i.e. the user task accesses global objects also accessed from higher priority processes), the run-time priority ceiling for the preemptable task is promoted in order to block the hazardous preemption. This promotion of the run-time priority ceiling effectively inverts the priority relationship between the task in the preempted process and potential preempting processes for the execution duration of the lower priority task. This inhibits hazardous interruptive accesses to the object by postponing preemption until the task has completed execution. This elevated preemption priority ceiling attribute assigned to all user tasks is determined by evaluating the static structure of the processes assigned to a node with only one task processing unit and provides full data integrity protection with minimal run-time cost. This technique applies equally well to protecting operational systems from data hazards.

Referring now to FIG. 15, the method 1500 includes in action 1510, associating individual tasks of a system with objects that the task references and with objects that the task generates. In an embodiment, the action 1510 includes developing a diagram associating individual tasks of a system with objects that the task references and with objects that the task generates, as illustratively described with reference to FIGS. 2, 3, and 4.

The method 1500 includes in action 1520, describing for individual processes of the system the tasks of each process. In an embodiment, the action 1520 further includes describing for individual processes of the system the chain of to-be-executed steps of each process. In an embodiment, the action 1520 includes developing a diagram describing for individual processes of the system, the chain of to-be-executed steps of each process as illustratively described with reference to FIG. 5. In an embodiment, the action 1520 includes developing a task sequence control diagram of the system 115, as illustratively described with reference to FIGS. 5, 6, 7, and 8.

The method 1500 includes in action 1530 for a task of a process to be executed exclusively by a single task processing unit of a node, determining a task preemption level of the task (i.e. a task instance associated with the process, task instance meaning the instance of the task as a unique step of the process) based at least partially on the priorities of other processes on the node that access the objects to be accessed by the task. For instance, in an embodiment the task preemption level may be the highest priority process of the system on the node that can generate the object. For instance, in an embodiment, the task preemption level may be the highest priority process of the system on the node that can reference the object. For instance, in an embodiment the task preemption level may be for a task that can reference an object, the highest priority process of the system on the node that can generate the object. For instance, in an embodiment the task that can generate an object may be the highest priority process of the system on the node that can reference or generate the object. For instance, in an embodiment the task preemption level may not be a lower priority than specified for the processes in which this task instance is a step. For instance, in an embodiment the task preemption level may be the higher priority of the highest priority process of the system on the node that can generate an object referenced by the task and the highest priority process of the system on the node that can reference or that can generate an object generated by the task. This latter embodiment is described more fully in method 1600 with reference to FIG. 16.

In an embodiment (not shown), in the action 1530 of determining a task preemption level of the task instance based on objects to be accessed by the task instance, the objects are global objects and, the method 1500 includes identifying global objects accessed by steps of processes allocated to a single common task processing unit. Moreover, in an embodiment the method 1500 includes in an action (not shown), including in a database 125 a record associating with a task instance for which a task preemption level is determined, the determined task preemption level of the task. In an embodiment, the record is included in the database 125 in a predefined format, so that the data can be accessed by a standardized simulation routine (not shown) for simulating the system 115, including simulating the execution of tasks as determined by their preemption levels. Moreover, in an embodiment, the method 1500 includes in an action (not shown), including in the database for a task instance for which a preemption level is not determined in action 1530, a default task preemption level. Moreover, in an embodiment, the default task preemption level is the priority level of the process that contains the task instance. Moreover, in an embodiment, a default task preemption level is determined and the task instance to be included in the database is a function of at least the task instance preemption level determined in action 1530 and the default level, such as illustratively the maximum of the default value and the task instance preemption level determined in action 1530.

Referring to FIG. 16, the method 1600 includes in action 1610, associating individual tasks of the system 115 with objects that the task references, and with objects that the task generates. In an embodiment, the action 1610 includes developing a diagram associating individual tasks of a system with objects that the task references and with objects that the task generates, as illustratively described with reference to FIGS. 2, 3, and 4.

The method 1600 includes in action 1620, describing for individual processes of the system the tasks of each process. In an embodiment, the action 1620 further includes describing for individual processes of the system the chain of to-be-executed steps of each process. In an embodiment, the action 1620 includes developing a diagram describing for individual processes of the system, the chain of to-be-executed steps of each process as illustratively described with reference to FIG. 5. In an embodiment, the action 1620 includes developing a task sequence control diagram of the system 115, as illustratively described with reference to FIGS. 5, 6, 7, and 8.

The method embodied in actions 1630, 1640, and 1650 together determine a first priority such that if a task is to reference an object, all generations of that object are blocked if the task priority is that of the object's first priority, and determining a second priority such that if a task is to generate an object, all accesses (references and generations) to that object are blocked if the task priority is that of the object's second priority. The determined preemption ceiling in action 1650 is the higher priority of the first priority and the second priority, so that if the task is to reference an object, all generations of that object are blocked by inhibiting (postponing) processes that can generate that object, and if the task is to generate an object, all other accesses to that object are blocked by inhibiting (postponing) processes that access that object.

The method 1600 includes in action 1630, for a process to be executed by only a single (i.e. a unitary quantity of) task processing units of a node and for a task of the process, for each object the step references, determining a first priority (the word "first" here being a label to distinguish this priority from a priority labeled a "second" priority, the word "second" distinguishing the priority from the first priority) as the highest priority process of the system on the node that can generate the object. The method 1600 includes in action 1640 for the process of action 1630, and for the task of the process, for each object the task generates, determining a second priority as the highest priority process of the system on the node that can reference, or that can generate the object.

The method 1600 includes in action 1650, determining the task preemption level of the task instance (i.e. a task instance associated with the process, task instance meaning the unique step in the process) contained in the process to be executed as the highest priority process of the first priority and the second priority.

In an embodiment of actions 1610, 1620, 1630 and 1640, the objects that a task references and/or generates are global objects, and the first priority and/or the second priority are determined specifically for only each global object, the method 1600 in this embodiment including identifying global objects accessed by steps of processes allocated to a single common task processing unit.

In an embodiment of actions 1610, 1620, 1630 and 1640, a global object with attributes identified as structurally immune from corruption is not considered in the calculation of a first or second priority, .g. all global objects. The method ignores these objects whose data integrity would not be compromised by preemption.

Moreover, in an embodiment the method 1600 includes in an action (not shown), including in a database 125 a record associating with each task instance for which a task preemption level is determined, the determined task preemption level of the task. In an embodiment, the record is included in the database 125 in a predefined format, so that the data can be accessed by a standardized simulation routine (not shown) for simulating the system 115, including simulating the execution of tasks as determined by their preemption levels. Moreover, in an embodiment, the method 1600 includes in an action (not shown), including in the database for a task instance for which a preemption level is not determined in action 1650, a default task preemption level. Moreover, in an embodiment, the action 1650 determines a task preemption level as the maximum of the task's default priority, the first priority for each identified object, and the second priority for each identified object that the task generates. Moreover, in an embodiment, the default task preemption level is the priority level of the process that contains the task instance. Notice that the method 1600 affects the structure of the process by assigning a preemption ceiling attribute to each task step, the actual contents of the task is unchanged and independent of the preemption attribute.

In an embodiment, the method 1500 and/or the method 1600 is at least partially embodied by an analysis routine. In an embodiment, the method 1500 and the method 1600 is at least partially performed by a manual procedure.

FIGS. 17 and 18 each portray an embodiment of the analysis process 135 for providing data integrity to processes executed by multiple processing units. In a process, some steps or loop iterations depend upon execution in a prescribed order, including iterations, in order to generate and to reference objects in a prescribed order. A process executed by multiple processing units may be subject to having some steps executed concurrently with, or executed before, a step which is prescribed to be executed before the steps. Execution out of order may be a hazard to objects generated by the process. In a multiprocessor environment, a step of a process can be determined to be inhibited while a previously initiated task from the same process has not yet completed execution, or to be executed concurrently with a task, thus protecting private objects by inhibiting execution of the step until the task to be executed has completed a prior execution, or allowing concurrent execution of the step. Private object means an object that is accessed by only a single process, i.e. the object does not communicate between different processes. These dependency mechanisms (step inhibition and/or step concurrency) ensure that loop iterations do not overlap, that the next loop iteration waits until the tasks of the prior iteration have completed to avoid multiple iterations of the same task instance executing concurrently.

An embodiment of the analysis process 135 portrayed with reference to FIG. 17 provides private data integrity by determining steps to be inhibited from executing while another task of the same process is executing. An embodiment of the analysis process 135 portrayed with reference to FIG. 18 provides data integrity by determining steps that may be executed concurrently with another task from the same process. Processes that can run on multiple CPUs must guard against task concurrency that could access dynamic data.

Dependency mechanisms inhibit initiation of steps that would cause a hazard if executed concurrently. These dependency mechanisms control parallel execution within processes allocated to multiple processing units, and in an embodiment is performed individually on processes without concern for the action of other processes. The mechanism of a dependency inhibit can protect a process from corrupting data used between steps within the process—objects that are private to the process. In operation, blocking a task if it cannot run concurrently with a task that is executing can control parallel execution within processes that are allocated to multiple processing units.

Referring now to FIG. 17, the method 1700 includes in action 1710, associating individual tasks of the system 115 with objects that the task references and with objects that the task generates. In an embodiment, the action 1710 includes developing a diagram associating individual tasks of a system with objects that the task references and with objects that the task generates, as illustratively described with reference to FIGS. 2, 3, and 4.

The method 1700 includes in action 1720, describing for individual processes of the system, the chain of executed steps of each process. In an embodiment, the action 1720 includes developing a diagram describing for individual processes of the system, the chain of to-be-executed steps of each process as described with reference to FIG. 5. In an embodiment, the action 1720 includes developing a task sequence control diagram of the system 115, as illustratively described with reference to FIGS. 5, 6, 7, and 8.

The method 1700 includes in action 1730, identifying the processes to be executed by multiple task processing units. This is an aspect of the design of the system 115, and may be ascertained from the design characteristics table 110D described with reference to FIG. 11, from the description language statements 1215 described with reference to FIGS. 12, 13, 14, and from the database 125.

The method 1700 includes in action 1740 for a process to be executed by multiple processing units, determining steps of the process to be inhibited from executing while a task of the process is still executing. This action is performed by determining whether if the step was not inhibited, an object could be generated before the other task references it, or an object could be referenced before the other task could generate changes to the object. The determining action is based on the association of tasks and their accessed objects that was determined in action 1710, and the precedence of steps in a process that was determined in action 1720. In an embodiment, the determining action 1730 contemplates an analysis of control loop overlapping, such as executing what should be a subsequent iteration prior to completing the tasks in a loop structure initiated earlier than what should be a preceding iteration, whereby depending data may be generated out of order.

The method 1700 includes in action 1750, including in the database 125 a record associating with each step determined to be inhibited, an indication that the step is to be inhibited by the execution state of other task(s) in the process, and an indication of the task(s) whose execution should be completed. In an embodiment, the record included in the database 125 is in a predefined format, so that the data can be accessed by a standardized simulation routine (not shown) for simulating the system 115 including simulating the execution of steps based on whether they are inhibited by concurrent execution of identified tasks.

In an embodiment, the method 1700 is at least partially embodied by an analysis routine. In an embodiment, the method 1700 is at least partially performed by a manual procedure.

In an embodiment, the determining action 1740 includes determining objects that do not require integrity protection, and excluding from consideration all accesses to these objects, i.e. accesses to these objects are declared to be safe under all conditions. These objects include objects that are not accessed randomly; such as objects accessed by a stacking method, or a queuing method; and objects that are constant, or not generated by a task.

Moreover, in an embodiment, the determining action 1740 includes determining those objects that are shadowed by another object, and excluding those objects from consideration as objects to be protected, because they have the same hazard creating potential as the object that shadows them. An object that is shadowed by another object has a usage profile that is contained in, or equivalent to, the usage profile of the object that shadows it, meaning that the steps that reference the shadowed objects also reference the shadowing object and tasks that generate the shadowed objects also generate the shadowing object. Thus any mechanism that protects the integrity of the shadowed object is redundant to the mechanism protecting the integrity of the shadowing object. Mechanisms protecting the shadowed objects are unnecessary, the shadowed objects are automatically protected in the shadow of the shadowing objects.

In an embodiment, a shadowed object can be determined by identifying the referencing tasks and the generating tasks in a task behavior diagram 110A (particularly a task behavior diagram 110A configured as a table (FIG. 3) or other are configured to allows ready comparison of the accesses of each task), and comparing them to the objects referenced and generated by the other tasks. For instance, with reference to FIG. 19 portraying a task behavior diagram 110A of an illustrative system, object 21 is shadowed by object 24 because task 2 references both object 21 and object 24 and tasks 3 and 4 generates both object 21 and object 24. Object 23 is shadowed by both object 22 and by object 24 because task 2 references objects 22, 23 and 24 and task 5 generates these same objects. Simply stated, the non-empty contents of a shadowed row matches the corresponding columns in the shadowing row. In an embodiment, shadowed objects are ignored from analysis in methods 1700 and 1800 without compromising the validity of the results. Here, illustratively as described with reference to FIG. 3, an "I" represents that the object is to be referenced by the task, and an "O" represents that the object is to be generated by the task.

Referring to FIG. 18, the method 1800 includes in action 1810, associating individual tasks of the system 115 with objects that the task references and with objects that the task generates. In an embodiment, the action 1810 includes developing a diagram associating individual tasks of a system with objects that the task references and with objects that the task generates, as illustratively described with reference to FIGS. 2, 3, and 4.

The method 1800 includes in action 1820, describing for individual processes of the system, the chain of executed steps of each process. In an embodiment, the action 1820 includes developing a diagram describing for individual processes of the system, the chain of to-be-executed steps of each process as described with reference to FIG. 5. In an embodiment, the action 1820 includes developing a task sequence control diagram of the system 115, as illustratively described with reference to FIGS. 5, 6, 7, and 8.

The method 1800 includes in action 1830, identifying the processes to be executed by multiple processing units. This is an aspect of the design of the system 115, and may be ascertained from the design characteristics table 110D described with reference to FIG. 11, from the description language statements 1215 described with reference to FIGS. 12, 13, 14, and from the database 125.

The method 1800 includes in action 1840 for a process to be executed by multiple processing units, for a step in the process, determining whether the step may be or may not be executed concurrently with another task of the process. This action is performed by determining whether if the step were executed concurrently, an object could be simultaneously generated and accessed (e.g. while an object is being generated it is either referenced or also generated by another step). Temporally separating these hazardous accesses can be accomplished by inhibiting steps that would cause the hazardous conditions until the currently accessing task(s) have completed execution thus removing the simultaneous access hazard.

The determining action is based on the association of tasks and their accessed objects that was determined in action 1810, and the precedence of steps in a process that was determined in action 1820. In an embodiment, the determining action 1840 contemplates an analysis of control loop overlapping, such as executing what should be a subsequent iteration of the steps in a loop structure earlier than completing what should be a preceding iteration, whereby single task instances would be simultaneously executing with data from multiple iterations on different task processing units. If such tasks are not explicitly designated as structured to support concurrent execution, the loop structure incorporates appropriate iteration overlap inhibits herein called dependencies.

In an implementation, the dependencies are optimized, i.e. the inhibiting tasks listed for a step are pruned of duplicates found on preceding steps. For example, if a step 10 is blocked until the task in a step 9 completes, a step 11 benefits from the step 10 inhibit and can prune a dependency on step 9 from the step 11 dependency list. In an implementation, this analysis considers all possible execution paths leading to each step. In particular, conditional or alteration logic can provide multiple paths leading to a step and the possible dependencies may differ according to the pruning used along each path. In an implementation, the dependency list for each step is the composite of the pruned dependency lists resulting from an analysis of each path leading to the step.

The method 1800 includes in action 1850, including in the database 125 a record associating whether the instance of the step in the process may or may not be executed concurrently with another task from the same process. In an embodiment, the record is included in the database 125 in a predefined format, so that the data can be accessed by a standardized simulation routine (not shown) for simulating the system 115, including simulating the execution of steps based on whether they may be executed concurrently with another task from the same process. Notice that the method 1800 affects the structure of the process by adding a dependency relationship to each step and does not change the content of a task or object in any way.

In an embodiment, the method 1800 is at least partially embodied by an analysis routine. In an embodiment, the method 1800 is at least partially performed by a manual procedure.

In an embodiment, the determining action 1840 includes determining objects that do not require integrity protection. These objects include objects that are immune from corruption (e.g. not accessed randomly; such as objects accessed by a stacking method, or a queuing method; and objects that are constant, or not generated by a task) or are protected by the shadow of another dataset. In an embodiment, these objects are excluded from consideration in 1810 and 1840 and any step whose execution accesses only these objects is excluded from consideration in 1810, 1820 and 1840.

As described with reference to method 1700, in an embodiment, the determining action 1840 includes determining objects that do not require integrity protection, and excluding from consideration a step whose execution accesses only these objects.

Moreover, as described with reference to method 1700, in an embodiment, the determining action 1840 includes determining those objects that are shadowed by another object, and excluding those objects from consideration in determining steps to be inhibited because these objects are not at risk and need not be protected.

The dependency mechanism protects objects accessed from only a single process executing in a multiprocessor node by attaching records to processing steps in the database representation. Objects accessed by multiple processes in a multiprocessor node cannot be fully protected from within a process, instead a node mechanism is required. In an embodiment, object locks are logically attached to the shared object representations to integrate the dynamic access history to that object. Steps that access lock protected objects check each corresponding lock to see if the step's execution would constitute a hazard. If execution would constitute a hazard then the step is inhibited, otherwise the access history is updated in the corresponding lock(s) and the step is launched. When the step completes, the appropriate lock access history is updated to remove the indication that the just completed step is accessing that object. Notice that the lock mechanism is integrated into the process structure, the individual tasks and objects are not directly involved or altered in any way.

In an embodiment, the analysis process 135 identifies the objects needing lock protection and includes the information in the database 125. Lock test records are appended to all process steps accessing these locked objects.

In an embodiment, these records are included in the database 125 in a predefined format, so that the data can be accessed by a standardized simulation routine (not shown) for simulating the system 115, including simulating the dynamic lock monitoring tests to determine if the step should be inhibited or can be executed without incurring a object integrity hazard.

Figure 20:
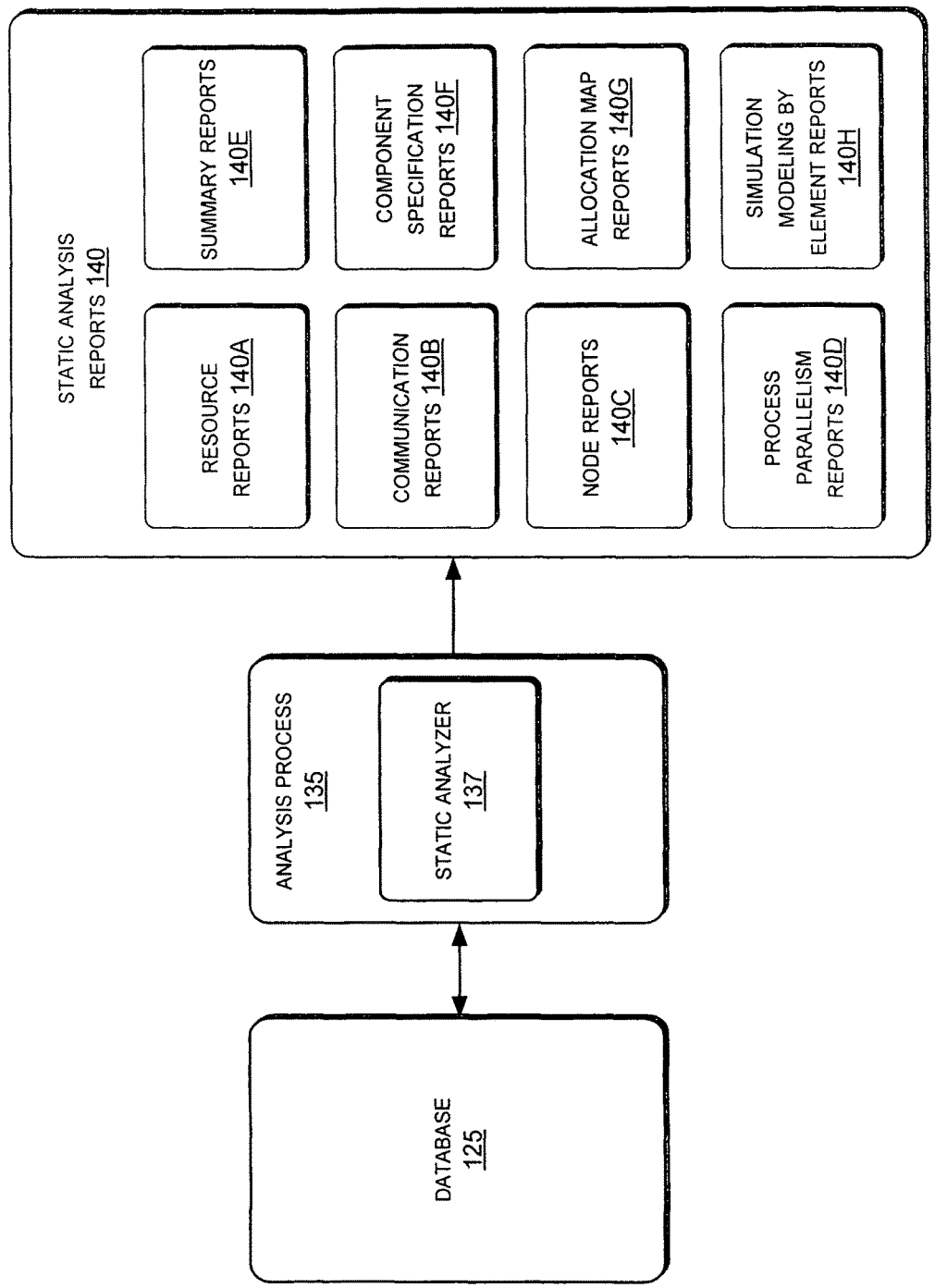
FIG. 20 is a block diagram of an embodiment of a static analyzer to generate static analysis reports of the structure of a modeled system.

Referring to FIG. 20, the analysis process 135 includes a static analyzer 137. In an embodiment, the static analyzer 137 is configured to generate static analysis reports 140. The static analysis reports 140 are summarized tabulations of components of the modeled system 115. In an embodiment, the static analyzer 137 generates these reports from data in the language statements 1215 description of the system 115, and/or data in the database 125. In an embodiment, the static analyzer 137 is configured to generate information indicating incomplete, missing, and/or inconsistent specification statements describing the system 115. In an embodiment, incomplete information is given default values in the database 125. In an embodiment, the data in the database 125 is arranged in a predefined format, so that the static analyzer 137 is configured as a standardized routine to access in operation the specific information from a database 125 arranged in a predefined format.

In an embodiment, the reports 140 include resource reports 140A listing the resources and their attributes (e.g. performance characteristics and operational overhead costs for the processing unit, the communication paths, and the node couplings); communications reports 140B listing the communication devices and their attributes (e.g. performance characteristics and operational overhead, connectivity including traffic, and/or message usage); and/or node reports 140C listing the processes, the process triggers and trigger sources, the process priorities, the tasks and control steps of each process, the objects each task of each process generates and references, memory allocation, and/or derived preemption levels; as determined with reference to FIG. 16, and/or the step dependencies as determined with reference to FIGS. 17 and 18.

In an embodiment, each node is analyzed to document the component cross references (between tasks and objects) based on structural use, and the node reports 140C include the component cross references. In an embodiment, object use determines its classification as constant (no task generates), private (only one process accesses this object), local (all accessing processes share the same priority level), global (accessing processes have multiple priority levels) and/or universal (objects accessed in multiple nodes). In an embodiment, the node reports 140C include object use classification.

In an embodiment, object integrity protection is defined for mechanisms that include task hazard preemption priority ceiling to protect objects accessed from a single task processing unit, step dependency hazard analysis identifying processing steps dependent upon the completion of prior tasks in the same process for processes in nodes with multiple task processing units, identification of shadowed objects and the objects shadowing them, and/or identification of lock objects and the process steps that access corresponding locked objects. In an embodiment, the node reports 140C include supporting accesses for at lest one of the object integrity mechanisms In an embodiment, a process parallelism analysis generates a process parallelism report 140D identifying sequences of process steps where the steps can be executed concurrently in any order without altering the validity of the outcome. In an embodiment, a storage analysis generates object storage unit (e.g. memory) allocation summary reports 140E by type (e.g. RAM and ROM) and allocation (e.g. system and buffers, task code and workspace, and objects containing variable and constant information). In an embodiment, a component specification report 140F is assembled and published for tasks and objects in the system including identification of physical size, function or structure and residency attributes. In an embodiment, an allocation map report 140G is published showing the node and specific task processing units allowed to execute each process.

In an embodiment, a simulation modeling element by use report 140H is published showing summaries of object flows, probe placements and/or engagement logic by use. In an embodiment, object connectivity by task is analyzed to generate object package recommendations that contain specific objects that share the same task access profiles, i.e. these objects can be packaged together to reduce complexity.

FIG. 21 portrays an illustrative method 2100 of modeling a design of a system. Referring to FIG. 21, the method 2100 includes in action 2110, developing for predefined system performance and resource characteristics, a diagram portraying the characteristics of the system. As described with reference to FIG. 1, the diagrams 110 separately portray at least a portion of the task interactions, the resource couplings, and the control steps of the processes of a design of the system. In an embodiment these diagrams include a table describing for predefined performance and control characteristics of a system, these characteristics and their values for the system. In an embodiment, the diagram includes a diagram associating individual tasks of the system with objects that the task references and with objects that the task generates, a diagram describing for individual processes of the system the chain of to-be-executed steps of each process, and/or a diagram describing a resource configuration of the system. In an embodiment, the chain of to-be-executed steps of each process includes tasks. In an embodiment, the chain of to-be-executed steps of a process includes a system directive. In an embodiment, the chain of to-be-executed steps of a process includes a process control directive. In an embodiment, the chain of to-be-executed steps of a process includes execution control logic. In an embodiment, the diagram includes a diagram describing for the processes, characteristic data that includes triggering conditions of each process, task processing units of the system that can execute the process, and/or nodes of the system that can execute the process, in operation of the system; and/or for at least one processing resource of the system, performance capability data, and/or processing overhead data. In an embodiment, the processing resources include a task processing unit, an object storage unit, a terminal unit, and/or a communication path.

In action 2120, the method 2100 includes converting information in the diagrams to a database that is structured according to, or arranged in, a predefined format. As described with reference to FIG. 14, the database includes the data characteristics of the processing resources described in the diagrams, a description of the steps that compose a process, and an assignment of the processes to individual resources of the modeled system. In an embodiment, the converting action includes converting the information into statements having a finite predefined grammar, and a finite quantity of predefined statements types so that the statements can be operated upon by an algorithm process to decode the statements into data of the database; and automatically compiling the statements into the data. As described with reference to FIGS. 12 and 13, the statements are in a description language, and as described with reference to FIG. 12, a compiling application (or compiler) decodes the statements into the data of the database, thus automatically compiling the statements.

In an embodiment, the method 2100 includes determining from the information in the database, a step of a process to inhibit while a task of the same process is executing so as to avoid corrupting an object or overlapping control iterations, within a process to be executed by multiple processing units. In an embodiment, the method 2100 includes including in the database a record associating with the step instance an indication that it is to be inhibited and an indication of the task whose concurrent execution would be avoided. An embodiment of a method to determine a step to be inhibited from executing is described with reference to FIG. 17. In an embodiment, the method 2100 includes determining from the information in the database, a step of a process that may not be executed concurrently with another task of the process to avoid corrupting an object, the process to be executed by multiple processing units. In an embodiment, the method 2100 includes including in the database a record associating with a step, whether it may, or may not, be executed concurrently with another task from the same process. An embodiment of a method to determine a step that may and/or may not be executed concurrently with another task of a process is described with reference to FIG. 18. In an embodiment, the method 2100 includes for a process to be executed by only a single processing unit, determining from the information in the database, a task preemption level for the task based on priorities of other processes on the node that access the objects to be accessed by the task. In an embodiment, the method 2100 includes including in the database a record that associates with the task instance the determined task preemption level of the task. An embodiment of a method to determine a preemption level of a task is described with reference to FIGS. 15 and 16. In an embodiment, the method 2100 includes including in the database a record that associates with the step instance the locked objects to be accessed by the step and including in the database a record identifying an object as being locked. An embodiment of a method to determine objects that are shadowed by other objects based upon their task access profiles and identification, of objects needing a lock to coordinate dynamic access integrity when accessed by steps from multiple processes executing in a node with multiple task processing units. In an embodiment, the method 2100 includes including in the database a record that associates with a step an indication of the locked objects referenced or generated by the step.

FIG. 22 portrays an illustrative method 2200 of modeling a design of a system. Referring to FIG. 22, the portrayed method 2200 includes actions 2210, 2220, 2230, and 2240 of developing different diagrams that portray at least a portion of the task interactions, resource couplings, and control steps of the design of the system. While the portrayed method 2200 includes developing each of these diagrams in a particular order, in other embodiments any combinations of these different diagrams may be developed in any order. In practice, a system model usually evolves, the model is iteratively refined from crude first concept approximations to a refined components architecturally tuned to optimize specific objectives.

Referring now to FIG. 22, the method 2200 of modeling a design of the system includes in action 2210 developing a task behavior diagram of the system. A task behavior diagram associates individual tasks of a system with the objects that the task references, and the objects that the task generates. The task behavior diagram is described further with reference to FIGS. 1, 2, 3, and 4. The method 2200 includes in action 2220 developing a task sequence control diagram of the system. A task sequence control diagram describes for individual processes of the system, the trigger condition, and the chain of to-be-executed steps of the system in response to the trigger condition, including the control logic that determines the sequence of task execution. The task sequence control diagram is described further with reference to FIGS. 1, 5, 6, 7, and 8. The method 2200 includes in action 2230 developing a resource configuration diagram of the system. A resource configuration diagram describes the coupled structures that at least in part execute (process, dispatch, discharge, work out, or the like) the processes of the system. The resource configuration diagram is described further with reference to FIGS. 1, 9 and 10. The method 2200 includes in action 2240 developing a design characteristics table diagram of the system. A design characteristics table diagram has values of design characteristics of the system that affect the performance and the control attributes of the system. In embodiments, at least some of the values are also or rather annotated in the task behavior diagram, the task sequence control diagram, and/or the resource configuration diagram. The design characteristics table diagram is described further with reference to FIGS. 1 and 11.

The method 2200 includes in action 2250 converting information in the task behavior diagram, the task sequence control diagram, the resource configuration diagram, and the design characteristics table diagram to a database that is structured according to, or arranged in, a predefined format. As described with reference to FIG. 14, the database includes the data characteristics of the processing resources described in the diagrams, a description of the steps that compose a process, and an assignment of the processes to individual resources of the modeled system. In an embodiment, the converting action includes converting the information into statements having a finite predefined grammar, and a finite quantity of predefined statements types so that the statements can be operated upon by an algorithm process to decode the statements into data of the database; and automatically compiling the statements into the data. As described with reference to FIGS. 12 and 13, the statements are in a specification language, and as described with reference to FIG. 12, a compiling application (or compiler) decodes the statements into the data of the database, thus automatically compiling the statements.

As described with reference to FIGS. 1, 2, 3, and 4, in an embodiment these diagrams include developing a diagram associating individual tasks of the system with objects that the task references and with objects that the task generates, developing a diagram describing for individual processes of the system the chain of to-be-executed steps of each process, and/or developing a diagram describing a resource configuration of the system. In an embodiment the chain of to-be-executed steps of each process includes tasks, system directives, process control directives, and/or execution control logic. In an embodiment, these diagrams further include a diagram describing for the processes, characteristic data that includes triggering conditions for each process, task processing units of the system that execute the process, and/or nodes of the system that execute the process, in operation of the system; and/or for at least one processing resource of the system, performance capability data, and/or processing overhead data. In an embodiment, the processing resources include a task processing unit, an object storage unit, a terminal unit, and/or a communication path.

Component characteristics can include simulation effects, i.e. modeled run-time effects resulting from actually executing tasks. These effects include 'Object Flows' that migrate operational objects between different operational states as the system model advances in time. These objects can represent any condition or abstraction envisioned by the user to express the run-time effects of task executions. Common parametric variables may also be supported to algorithmically represent different facets of a task's temporal behavior.

In an embodiment, the method 2200 includes performing an analysis of the static structure of the system based on the information in the database. An embodiment of a method to perform an analysis of the static structure of a system is described with reference to FIG. 20.

The foregoing detailed description has set forth various embodiments of the devices and/or processes via the use of block diagrams, flowcharts, and examples. Insofar as such block diagrams, flowcharts, and examples contain one or more functions and/or operations, it will be understood that each function and/or operation within such block diagrams, flowcharts, or examples can be implemented, individually and/or collectively, by a wide range of hardware, software, firmware, or virtually any combination thereof. In an embodiment, certain aspects of the present invention may be implemented via Application Specific Integrated Circuits (ASICs), Field Programmable Gate Arrays (FPGAs), or other integrated formats. However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the capability of one skilled in the art in light of this disclosure. In addition, those skilled in the art will appreciate that the certain mechanisms of the present invention are capable of being distributed as a program product in a variety of forms, and that an illustrative embodiment of the present invention applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

Those skilled in the art will recognize that it is common within the art to describe devices and/or processes in the fashion set forth herein, and thereafter use standard engineering practices to integrate such described devices and/or processes into data processing systems. That is, at least a portion of the devices and/or processes described herein can be integrated into a data processing system via a reasonable amount of experimentation.

While particular embodiments of the present invention have been shown and described, it will be understood that changes and modifications may be made without departing from this invention and its broader aspects and, therefore, the appended claims are to encompass within their scope all such changes and modifications as are within the true spirit and scope of this invention. Furthermore, it will be understood that the invention is solely defined by the appended claims. It will be understood that in general, terms used herein, and especially in the appended claims are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

The invention is not intended to be limited to the embodiments shown, but is to be accorded the widest scope consistent with the principles and features disclosed herein. This application is intended to cover any adaptations or variations of the embodiments discussed herein. Accordingly, the invention is not limited, except as by the appended claims. With regard to the claims, the order of description of acts or operations should not be construed to imply that these acts or operations are necessarily order dependent.

What is claimed is:

1. A method of providing data integrity protection in a multiprocessor computer system by controlling the execution of processes in the computer system, comprising:
   developing process information data indicating: an association of individual steps of the computer system with objects that the step executes, with objects that the step references, and with objects that the step generates; for individual processes of the computer system, the chain of to-be-executed steps of each process; and a physical configuration of the computer system, including an allocation of processes to processors;
   developing for at least one step of the computer system, step data indicating: 1) whether the step is configured to write data that is either being referenced or being generated, and/or 2) whether the step is configured to read data that is being generated, and/or 3) whether the step is configured to invoke non-reentrant code being executed, and/or 4) whether the step is configured as a control step whose execution is configured to depend upon a specific step executing;
   storing in a computer database the developed process information data and the step data;
   for at least one processor of the computer system,
      a routine resident and executing on a processor of the computer system in operative communication with the database, determining for a step of the computer system scheduled for execution on the processor, based on the stored in the database developed process information data and developed step data, whether at least one of the following conditions is present: 1) the data the step is configured to write is currently being referenced or generated, 2) the data the step is configured to read is currently being generated, 3) the non-reentrant code the step is configured to invoke is currently being executed, and 4) the specific step upon which the execution of the control step depends in the computer system is executing;
      if at least one of these conditions is present, the routine determining that the execution of the particular step is to be blocked; and the routine executing the processes of the processor based on the stored process information data, by not calling a step to be executed if the step is determined to be blocked, and calling the step to be executed if the step is not determined to be blocked, whereby in executing the processes data integrity is provided to the processes.

2. The method of claim 1 further comprising:

the routine determining and maintaining status over time of the following conditions: 1) whether the data the step is configured to write is referenced or generated, 2) whether the data the step is configured to read is generated, 3) whether the non-reentrant code the step is configured to invoke is executing, and 4) whether said specific step is executing;

and wherein the routine in determining whether the execution of the particular step is to be blocked comprises the routine referencing the maintained status over time.

3. The method of claim 1 comprising:

generating a static analysis report based on the process information data.

4. The method of claim 1:

wherein the developing process information data includes describing a relative priority of the processes; and further comprises generating a static analysis report based on the process information data.

5. The method of claim 1 wherein the developing process information action further includes describing a relative priority of the processes;

and the method further comprises:

separately storing in the database the process information data and the step data such that the stored step data do not affect the stored process information data.

6. The method of claim 1 further comprising for each said step of the system:

the routine determining if multiple data is referenced and generated by the step and if so, excluding from consideration in the act of developing data indicating whether each step is configured to write data being referenced or generated, all said multiple data but one; whereby shadowed data is excluded from consideration as step data.

7. The method of claim 1 comprising:

for objects accessed from steps to be executed by multiple task processing units of the computer system, identifying shadowed objects based on the process information data.

8. The method of claim 7 wherein the identifying action is based on identifying objects with a step access profile that are a subset of a step access profile for another object.

9. The method of claim 7 further comprising:

storing in the database the data indicating the identified shadowed objects; and the routine reading the stored process information, and executing by the routine, and the routine executing processes and configured to execute the processes according to the read stored process information and the identified shadowed objects.

10. The method of claim 1 wherein the process information includes for each process an identification of an event that operates to trigger the process, a priority of the process, a resource of the system that executes an executing process, and the to-be-executed steps of the process and a step type, and the routine operating as an operating system, executing the system.

11. A method of controlling execution of processes to be executed by a single task processing unit in a computer system comprising:

developing process information data:

associating with individual tasks of the processes: 1) non-reentrant code objects that the task is configured to execute, 2) data objects that the task is configured to reference, and 3) data objects that the task is configured to generate; and determining for each task of the processes, the highest priority level of the following four priorities: 1) for each data object the task is configured to reference, the highest priority level of any process containing a step configured to generate the object, 2) for each data object the task is configured to generate, the highest priority level of any process containing a step configured to either generate the object or reference the object, 3) for non-reentrant code objects the task is configured to execute, the highest priority level of any process containing a step configured to execute the object, and 4) a default priority level equal to the priority of the process containing the task;

storing in a computer database the process identification data and the highest priority level for each of the tasks;

a routine resident in the processing unit and configured to execute in the processing unit, in operative communication with the database, executing in the processing unit by:

reading the stored process information data, determining during execution of a task from the read process information data, whether the process contains at least one step configured to: 1) generate an object which the executing task is configured to reference, and/or 2) reference or generate an object the executing task is configured to generate, and/or 3) execute a non-reentrant code object the executing task is configured to execute;

and if the process contains at least one of the steps, the routine reading from the database the highest priority level and blocking the process from preempting the task.

12. The method of claim 11 wherein the routine blocking the process from preempting the task comprises:

the routine replacing the task's priority level with the read from the database highest priority level, whereby preemption of the task by the process is blocked during execution of the task.

13. A method of executing processes in a node of a computer system having a single processing unit by conditionally blocking preemption based on process priority, comprising:

associating individual tasks to be executed by the processing unit with objects that the task references, with objects that the task generates, and with objects that the task executes;

describing for individual processes to be executed by the processing unit the steps of each process; and for each process of the system to be executed by the processing unit, for each task of the process, determining a task preemption level of the task instance based at least partially on priorities of other processes that access the objects to be accessed by the task;

including in a computer database first data representing the association of individual tasks to be executed by the processing unit with objects that the task references and with objects that the task generates and with objects that the task executes;

including in the computer database second data representing for individual processes to be executed by the processing unit, the steps of each process, and priority of the process, including in the computer database third data representing the association of each task instance for which a task preemption level is determined, the determined task preemption level of the task;

a routine resident in the processing unit and configured to execute in the processing unit, in operative communication with the computer database, reading the stored first data and the stored second data;

the routine executing a task in the processing unit based on the first data and the second data;

the routine reading the third data for the task and determining for the task whether preemption by another process is to be blocked based on whether the priority level of the another process is more urgent than the priority level of the executing task; and if preemption by the another process is not determined to be blocked, the routine preempting the executing task in the processing unit.

14. The method of claim 13 wherein the routine determining action further comprises the routine determining a task preemption level of the task as a maximum of a default value and a task preemption level that is based on priorities of the other processes.

15. The method of claim 13 wherein a default task preemption level is the priority level of the process that contains the task.

16. The method of claim 13 comprising:
for the each task of the process, the determined task preemption level includes
for each object that the task references, determining a first priority as the highest priority assigned to any process on the node that can generate the object,
for each object that the task generates, determining a second priority as the highest priority assigned to any process on the node that can reference or that can generate the object, and
determining a task preemption level of the task as the higher priority of the first priority and the second priority.

17. The method of claim 16 wherein the determining a task preemption level further comprises determining a task preemption level of the task contained in the process to be executed as the maximum of a default value and the task preemption level determined in claim 16.

18. The method of claim 13 comprising:
storing the processes in the database, and wherein the stored task preemption level is stored separately from the stored processes such that the stored task preemption level does not affect the components of the stored processes;
whereby the stored processes are executable by a routine configured to read the stored processes and the task preemption levels in the database, and the processes are executable according to the task preemption levels.

19. The method of claim 13 comprising:
executing the stored processes by a routine configured to read the stored processes and the task preemption levels in the database, and the processes for which a task preemption level has been determined are executed according to the task preemption levels.

20. The method of claim 13 wherein for a task having a task preemption level not determined, including in the database a record associating the task with a default task preemption level.

21. A system that includes at least one processor, comprising:
a computer memory storing data that includes:
data indicating system process information that includes: data associating individual steps of the system with objects that the step executes, with objects that the step references and with objects that the step generates; for individual processes of the system, data identifying a chain of to-be-executed steps of each process; and data representing a physical configuration of the system that includes data identifying an allocation of processes to processors; and
for at least one process of the system, for at least one step of the process, step descriptive data indicating whether the step is configured to perform the following actions: to write data that is either being referenced or being generated, and/or to read data that is being generated, and/or to invoke non-reentrant code being executed, and/or as a control step whose execution is configured to depend upon a specific step being executed; and
a routine resident and executing on the processor that hosts the process and operationally coupled to the memory, configured:
to read the stored data indicating system process information and data indicating whether the at least one step is configured to perform the stored step descriptive data,
based on the read step descriptive data, to determine for the at least one step scheduled for execution whether at least one of the following conditions is present:
1) the data the step is configured to write is currently being referenced or generated, 2) the data the step is configured to read is currently being generated, 3) the non-reentrant code the step is configured to invoke is currently being executed, and 4) the specific step upon which the execution of the control step depends in the computer system is executing;
and if at least one of these conditions is present, the routine configured to determine that the execution of the step is to be blocked; and
the routine configured to execute the process based on the stored process information data, by not calling the step to be executed if the step is determined to be blocked, and calling the step to be executed if the step is not determined to be blocked, whereby in executing the processes, data integrity is provided to the process,
whereby the system, in executing the processes, implements data integrity protection by identifying potential data integrity hazards and indicating when a particular step is to be blocked.

22. The system of claim 21 wherein for a process to be executed by plural processors,
the memory is storing data including:
an indication that a step may be executed concurrently with a task from another process; and/or
an indication that the step may not be executed concurrently with another task from the process; and
the routine is configured to read the data and execute the process based on the read data, and allow execution of the step concurrently with the task if the data includes an indication that the step may be executed concurrently with the task.

23. The system of claim 21 wherein:

the memory stores data describing the individual processes of the system including an identification of an event that operates to trigger the process, a priority of the process, a resource of the system that executes an operating process, and to-be-executed steps of the process and a step type; and the routine is further configured to read the stored data representing the individual processes of the system including the identification of an event that operates to trigger the process, the priority of the process, the resource of the system that executes an operating process; and to execute the process in response to an event that operates to trigger the process and the priority of the process in the stored identified resource.

* * * * *